United States Patent
Kato et al.

(10) Patent No.: US 9,362,840 B2
(45) Date of Patent: Jun. 7, 2016

(54) POWER CONVERSION DEVICE

(71) Applicant: MITSUBISHI ELECTRIC CORPORATION, Chiyodu-ku (JP)

(72) Inventors: Sho Kato, Chiyoda-ku (JP); Hisanori Yamasaki, Chiyoda-ku (JP); Yuruki Okada, Chiyoda-ku (JP); Yoshinori Yamashita, Chiyoda-ku (JP)

(73) Assignee: Mitsubishi Electric Corporation, Chiyoda-ku (JP)

(*) Notice: Subject to any disclaimer, the term of this patent is extended or adjusted under 35 U.S.C. 154(b) by 0 days.

(21) Appl. No.: 14/429,537

(22) PCT Filed: Aug. 22, 2013

(86) PCT No.: PCT/JP2013/072368
§ 371 (c)(1),
(2) Date: Mar. 19, 2015

(87) PCT Pub. No.: WO2014/064996
PCT Pub. Date: May 1, 2014

(65) Prior Publication Data
US 2015/0236609 A1    Aug. 20, 2015

(30) Foreign Application Priority Data

Oct. 23, 2012 (JP) .................................. 2012-233347

(51) Int. Cl.
*H02M 7/5387* (2007.01)
*H02M 7/06* (2006.01)
(Continued)

(52) U.S. Cl.
CPC ................. *H02M 7/06* (2013.01); *G01R 19/00* (2013.01); *H02M 7/46* (2013.01)

(58) Field of Classification Search
CPC ..................... H02M 7/487; H02M 2001/0025; B60L 2200/26; B60L 9/22
USPC ..................... 363/16, 17, 34, 37, 41, 98, 132; 318/799, 801, 811
See application file for complete search history.

(56) References Cited

U.S. PATENT DOCUMENTS 5,361,196 A *  11/1994  Tanamachi ................ B60L 9/22
                                                    318/811
5,375,050 A   12/1994  Nakata et al.
(Continued)

FOREIGN PATENT DOCUMENTS

JP     05-146160    6/1993
JP     10-234187    9/1998
(Continued)

OTHER PUBLICATIONS

International Search Report issued Nov. 5, 2013 in PCT/JP2013/072368 filed Aug. 22, 2013.

*Primary Examiner* — Rajnikant Patel
(74) *Attorney, Agent, or Firm* — Oblon, McClelland, Maier & Neustadt, L.L.P.

(57) ABSTRACT

A control section for controlling a 3-level power conversion circuit. The control section calculates ON voltage error based on time ratios of three potentials in a predetermined certain period and a current value from a current detection section for detecting current outputted from the 3-level power conversion circuit, corrects a voltage command value based on a voltage correction amount for correcting the ON voltage error, and performs ON/OFF control for semiconductor switching elements of the 3-level power conversion circuit based on the corrected voltage command value.

7 Claims, 15 Drawing Sheets

(51) Int. Cl.
*G01R 19/00* (2006.01)
*H02M 7/46* (2006.01)

(56) References Cited

U.S. PATENT DOCUMENTS

| | | | | | |
|---|---|---|---|---|---|
| 5,436,819 | A | * | 7/1995 | Mikami | H02M 1/38 363/132 |
| 5,506,765 | A | * | 4/1996 | Nakata | B60L 9/22 363/132 |
| 5,627,742 | A | * | 5/1997 | Nakata | B60L 9/22 323/235 |
| 6,031,738 | A | * | 2/2000 | Lipo | H02M 7/487 363/37 |
| 6,795,323 | B2 | * | 9/2004 | Tanaka | H02M 7/487 363/132 |
| 7,495,938 | B2 | * | 2/2009 | Wu | H02M 7/487 363/172 |
| 8,953,345 | B2 | * | 2/2015 | Jimichi | H02M 7/53803 363/37 |
| 2003/0169611 | A1 | | 9/2003 | Nishizawa et al. | |
| 2012/0127768 | A1 | | 5/2012 | Sekimoto | |

FOREIGN PATENT DOCUMENTS

| | | |
|---|---|---|
| JP | 2004-173449 A | 6/2004 |
| JP | 2008-048537 A | 2/2008 |
| JP | 2010-154726 A | 7/2010 |
| JP | 2011-050234 A | 3/2011 |
| WO | 02/084855 A1 | 10/2002 |

* cited by examiner (A) CARRIER WAVEFORM, MODULATION WAVE (B) SU1

(C) SU2

(D) PWM WAVEFORM

CASE OF I > 0

POWER CONVERSION DEVICE

TECHNICAL FIELD

The present invention relates to a power conversion device that converts DC power to AC power or conversely, converts AC power to DC power, and particularly to a power conversion device to which a 3-level power conversion circuit is applied.

BACKGROUND ART

Conventionally, there is known a power conversion device that includes an inverter circuit having a plurality of semiconductor switching elements, and a switching control section for controlling driving of the semiconductor switching elements. Such power conversion devices are widely used for, for example, home electrical appliances, industrial equipment, and the like for which the rotation rate or torque of a motor needs to be controlled.

In order to operate the motor efficiently, it is desirable to perform so-called vector control for controlling voltage and current in accordance with the speed and the rotor position of the motor. For performing the vector control, a predetermined sensor is provided to detect the speed and the rotor position of the motor, but this leads to cost increase of the power conversion device.

Therefore, so-called sensorless vector control has been widely applied which performs motor control without detecting the speed and the rotor position of the motor by a sensor. In the sensorless vector control, the speed and the rotor position of the motor are estimated from voltage applied to the motor and current flowing in the motor. In a general power conversion device, a voltage command is used as the voltage applied to the motor in this case.

In the power conversion device, generally, a flyback diode is connected in antiparallel with each semiconductor switching element. Due to ON voltage drop when current flows in the semiconductor switching element or the flyback diode, the actual voltage applied to the motor has error from the voltage command. As a result, distortion occurs on output current or torque. In addition, since the actual voltage applied to the motor has error from the voltage command as described above, instability or the like in the sensorless vector control arises.

Considering the above, for example, as in Patent Document 1 below, a method of correcting the voltage command taking into consideration ON voltage drop when current flows in the semiconductor switching element or the flyback diode, is proposed.

CITATION LIST

Patent Document

Patent Document 1: Japanese Laid-Open Patent Publication No. 2010-154726

SUMMARY OF THE INVENTION

Problems to be Solved by the Invention

However, the conventional technique disclosed in Patent Document 1 is a correction method for a voltage command to a 2-level inverter, but the detailed description about application to a 3-level inverter is not disclosed.

As described in the above Patent Document 1, a 2-level inverter selectively derives two voltage levels to an output terminal of the inverter, thereby controlling output voltage. A main circuit of the inverter has six switching elements. A single carrier is used when PWM modulation control (hereinafter, referred to as PWM control) is performed for the switching elements.

On the other hand, a 3-level inverter divides DC power supply voltage into two DC voltages by capacitors connected in series, to generate three voltage levels (potentials) of a positive level (high potential), a zero level (intermediate potential), and a negative level (low potential), and selectively derives the three voltage levels to an output terminal of the inverter through ON/OFF operation of switching elements composing a main circuit of the inverter, thereby controlling output voltage. In this case, the main circuit of the 3-level inverter has twelve switching elements, and two carriers are used when PWM control is performed for the switching elements.

Thus, the 2-level inverter and the 3-level inverter are different not only in their main circuit configurations but also in their output voltages and the number of carriers used in PWM control. Therefore, in the case of correcting a voltage command taking into consideration ON voltage drop when current flows in a semiconductor switching element or a flyback diode, it is difficult to directly apply the technique for a 2-level inverter as shown in Patent Document 1 to a 3-level inverter.

The present invention has been made to solve the above problem, and an object of the present invention is to provide a power conversion device to which a 3-level power conversion circuit for generating three levels of voltages is applied and which is capable of accurately compensating ON voltage drop when current flows in a semiconductor switching element or a flyback diode.

Solution to the Problems

A first power conversion device according to the present invention includes: a 3-level power conversion circuit having a plurality of semiconductor switching elements and a plurality of flyback diodes, for converting DC voltage to voltage having three potentials of positive voltage, negative voltage, and zero voltage; a current detection section for detecting a current value inputted to or outputted from a terminal having the three potentials of the 3-level power conversion circuit; a voltage detection section for detecting the DC voltage; and a control section for performing ON/OFF control for the semiconductor switching elements of the 3-level power conversion circuit based on a voltage command value, wherein the control section calculates ON voltage error caused due to ON voltage drop when current flows in the semiconductor switching elements and the diodes, based on time ratios of the three potentials in a predetermined certain period and the current value from the current detection section, corrects the voltage command value by a voltage correction amount for correcting the ON voltage error, and performs ON/OFF control for the semiconductor switching elements of the 3-level power conversion circuit based on the corrected voltage command value.

A second power conversion device according to the present invention includes: a 3-level power conversion circuit having a plurality of semiconductor switching elements and a plurality of flyback diodes, for converting DC voltage to voltage having three potentials of positive voltage, negative voltage, and zero voltage; a current detection section for detecting a current value inputted to or outputted from a terminal having the three potentials of the 3-level power conversion circuit; a voltage detection section for detecting the DC voltage; and a control section for performing ON/OFF control for the semiconductor switching elements of the 3-level power conversion circuit based on a voltage command value, wherein the control section calculates ON voltage error caused due to ON voltage drop when current flows in the semiconductor switching elements and the diodes, based on a ratio between the voltage command value and the DC voltage, and the current value from the current detection section, corrects the voltage command value by a voltage correction amount for correcting the ON voltage error, and performs ON/OFF control for the semiconductor switching elements of the 3-level power conversion circuit based on the corrected voltage command value.

Effect of the Invention

Owing to the above configuration, the first power conversion device according to the present invention can compensate ON voltage drop, prevent distortion on output current or torque due to voltage error, and output voltage with no error from a voltage command, thereby improving stability of sensorless vector control.

Owing to the above configuration, the second power conversion device according to the present invention can compensate ON voltage drop, prevent distortion on output current or torque due to voltage error, and output voltage with no error from a voltage command, thereby improving stability of sensorless vector control.

DESCRIPTION OF EMBODIMENTS

Embodiment 1

Figure 1:
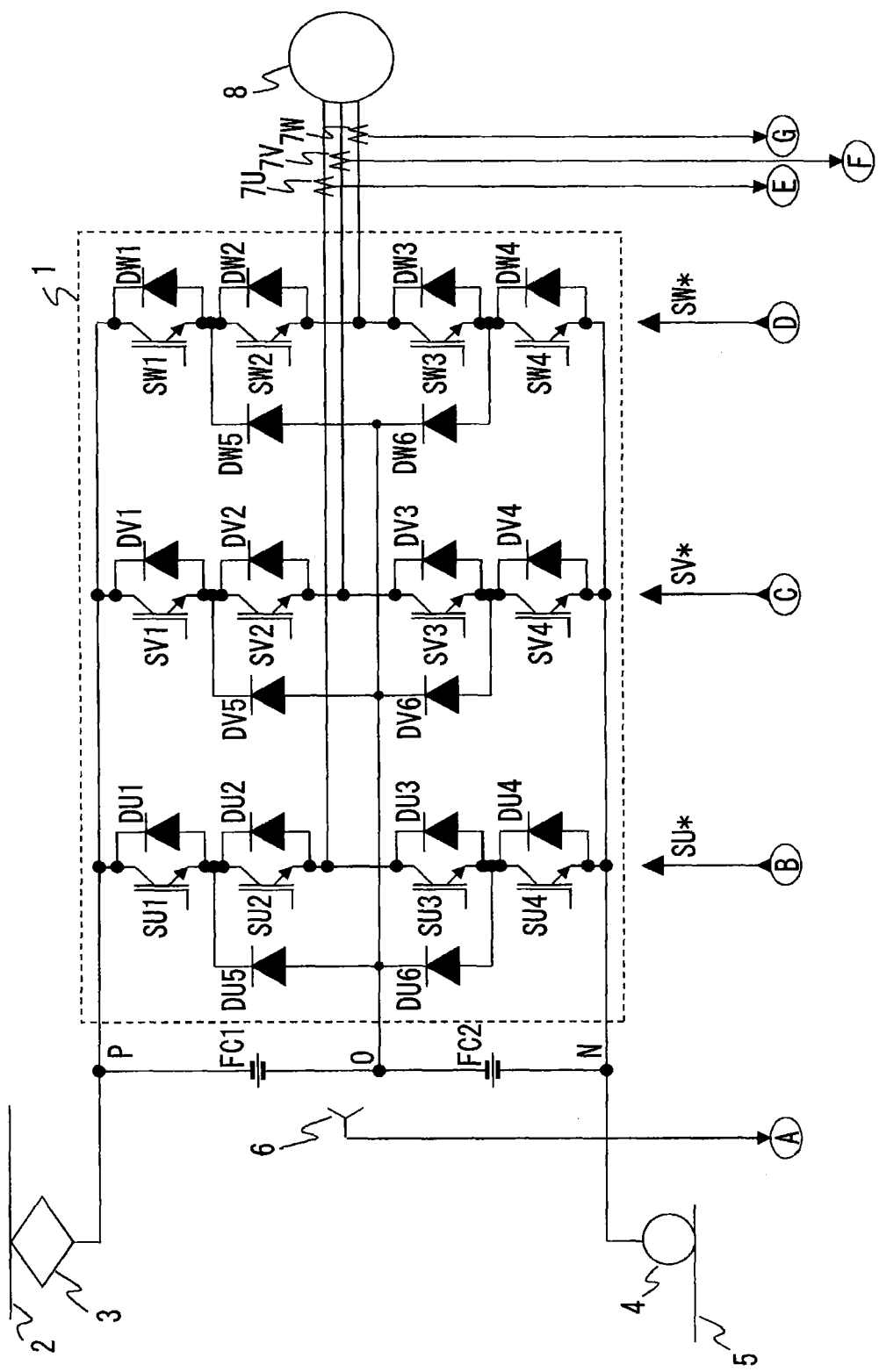
FIG. 1 is a configuration diagram of a power conversion device according to embodiment 1 of the present invention.
Figure 2:
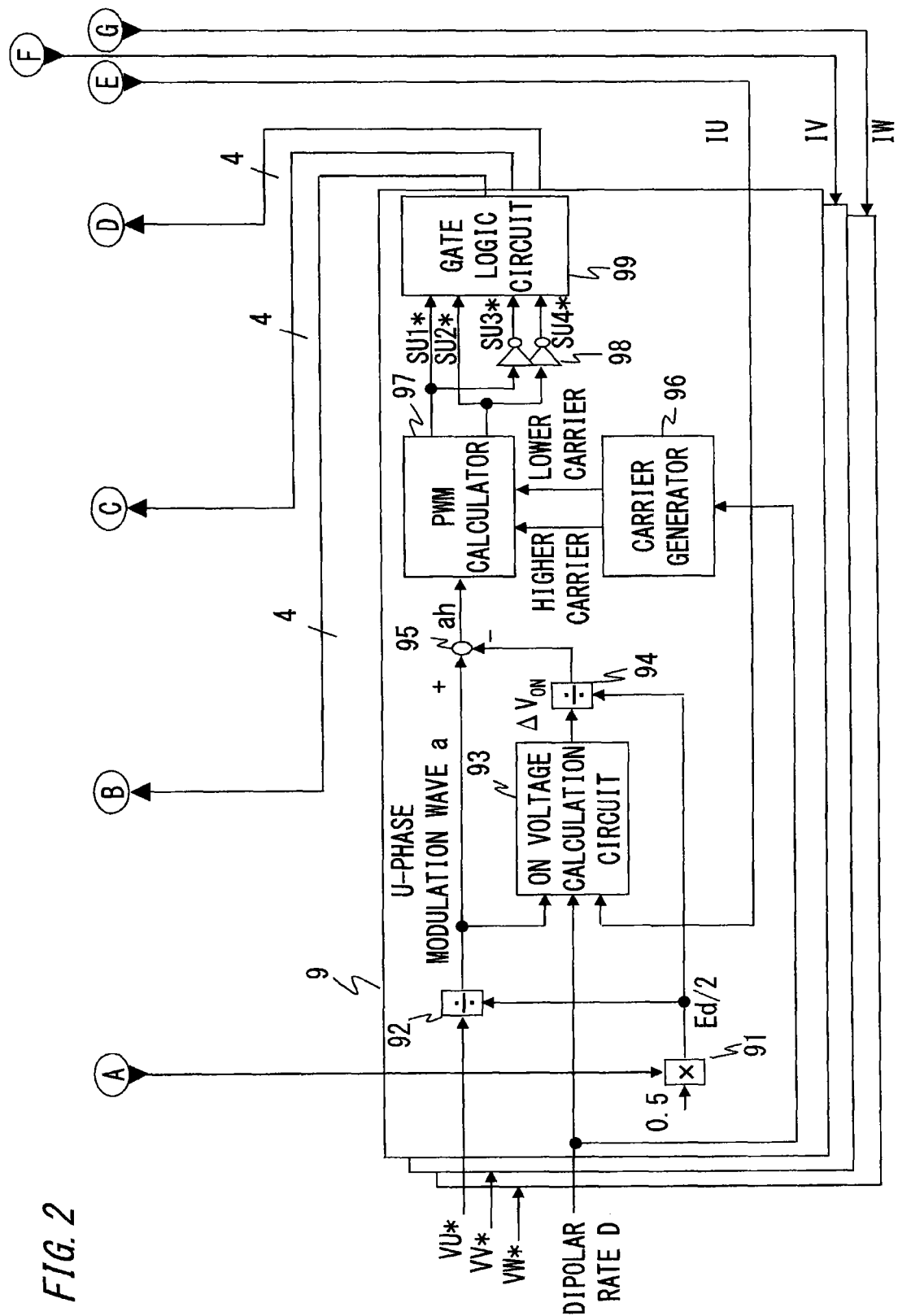
FIG. 2 is a configuration diagram of the power conversion device according to embodiment 1 of the present invention.

FIG. 1 and FIG. 2 are configuration diagrams of a power conversion device according to embodiment 1 of the present invention, and show an example in which a 3-level inverter of neutral point clamp type is applied to an electric railroad vehicle.

In FIG. 1 and FIG. 2, a character 1 denotes a 3-level power conversion circuit (hereinafter, referred to as a main circuit) forming a 3-level inverter of neutral point clamp type, a character 2 denotes an electric wire as a DC voltage source, a character 3 denotes a current collector, a character 4 denotes a wheel, a character 5 denotes a rail, a character 6 denotes a voltage detection section, and characters 7U, 7V, and 7W denote current detection sections. Characters FC1 and FC2 denote voltage dividing capacitors for generating, from the electric wire 2, intermediate voltage (neutral point voltage) corresponding to a zero potential on an AC voltage output side. Here, voltage of the electric wire 2 is Ed, and each voltage of the voltage dividing capacitors FC1 and FC2 is Ed/2. A character 8 denotes a load, which is, in embodiment 1, an induction motor. A character 9 denotes a control section for controlling the main circuit 1.

The main circuit 1 includes twelve semiconductor switching elements (hereinafter, simply referred to as switching elements) SU1 to SU4, SV1 to SV4, and SW1 to SW4 which are capable of self-turn-off, and flyback diodes DU1 to DU4, DV1 to DV4, and DW1 to DW4 respectively connected in antiparallel to the switching elements SU1 to SU4, SV1 to SV4, and SW1 to SW4. In this case, the four switching elements SU1 to SU4 and the four diodes DU1 to DU4 compose a switching arm for U phase. Likewise, the switching elements SV1 to SV4 and the diode DV1 to DV4 compose a switching arm for V phase, and the switching elements SW1 to SW4 and the diodes DW1 to DW4 compose a switching arm for W phase. Here, the switching elements SU1 to SU4, SV1 to SV4, and SW1 to SW4 are IGBTs. However, they may be GTOs, transistors, or MOSFETs. The switching arms for U, V, and W phases can perform independent operations for the respective phases, and are subjected to ON/OFF control based on a U-phase switching command SU*, a V-phase switching command SV*, and a W-phase switching command SW* outputted from the control section 9, thereby generating 3-level output voltages.

The voltage detection section 6 detects DC voltage Ed between P and N and sends the detected voltage to the control section 9. The current detection sections 7U, 7V, and 7W respectively detect phase currents IU, IV, and IW supplied from the main circuit 1 to the load 8, and send the detected currents to the control section 9. The current detection sections 7U, 7V, and 7W are not limited to a CT (Current Transformer) for detecting current flowing in connection lines between the main circuit 1 and the load 8, but may detect current flowing in shunt resistors or the like. Since the phase currents satisfy a relationship of IU+IV+IW=0, for example, one of the current detection sections 7U, 7V, and 7W, e.g., 7W may be omitted and the phase current IW may be calculated from the phase currents IU and IV respectively detected by the two current detection sections 7U and 7V.

The control section 9 receives a U-phase voltage command value VU* given from superior control means (not shown), generates a U-phase switching command SU* based on DC voltage Ed, current IU, and a dipolar rate D (described later), and outputs the U-phase switching command SU* to the main circuit 1. The U-phase switching command SU* includes four signals for respectively performing ON/OFF control for the four switching elements SU1 to SU4 composing the U-phase switching arm. The control section 9 receives a V-phase voltage command value VV*, generates a V-phase switching command SV* based on DC voltage Ed, current IV, and the dipolar rate D (described later), and outputs the V-phase switching command SV* to the main circuit 1. The control section 9 receives a W-phase voltage command value VW*, generates a W-phase switching command SW* based on DC voltage Ed, current IW, and the dipolar rate D (described later), and outputs the W-phase switching command SW* to the main circuit 1.

Next, PWM control for a 3-level inverter will be described. As a representative example of PWM control, dipolar modulation is known. In the dipolar modulation, positive and negative voltage pulses are alternately outputted via zero voltage within a half cycle of a reference signal wave, that is, within a half cycle of output voltage of the main circuit 1, thereby controlling the output voltage.

As another PWM control method, a method using unipolar modulation (pulse voltage with a single polarity is outputted within a half cycle of a reference signal wave, that is, within a half cycle of output voltage of the main circuit 1, thereby controlling the output voltage), and a method using partial dipolar modulation (a control method alternately performing the dipolar modulation and the unipolar modulation within the same cycle) are known. The details of these are disclosed in, for example, Japanese Laid-Open Patent Publication No. 5-146160.

In the present embodiment 1, a method for correcting ON voltage drop in dipolar modulation will be described.

Figure 3:
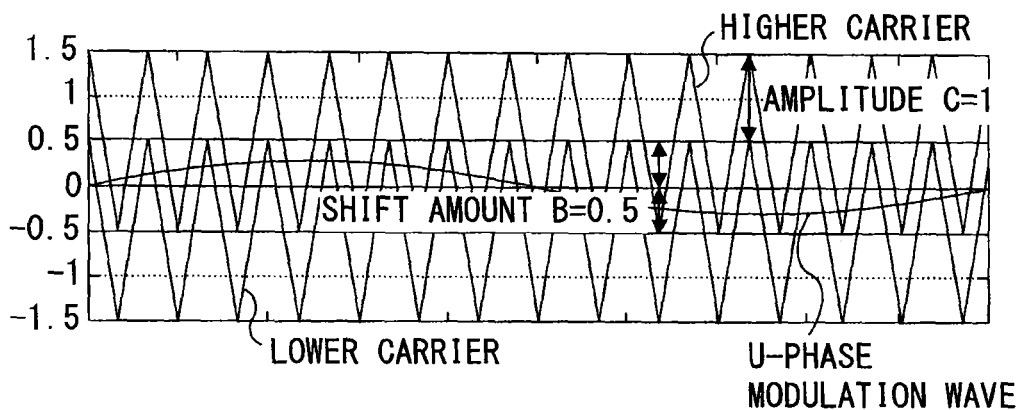
FIG. 3 is an explanation diagram showing an example in which PWM control by dipolar modulation is performed for semiconductor switching elements composing a 3-level power conversion circuit of the power conversion device.
Figure 3:
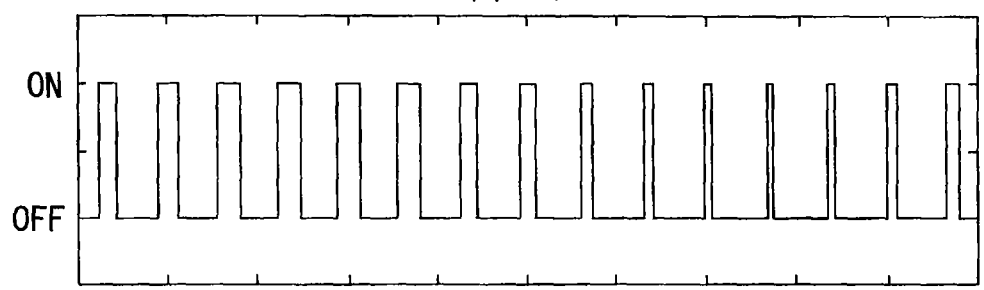
Figure 3:
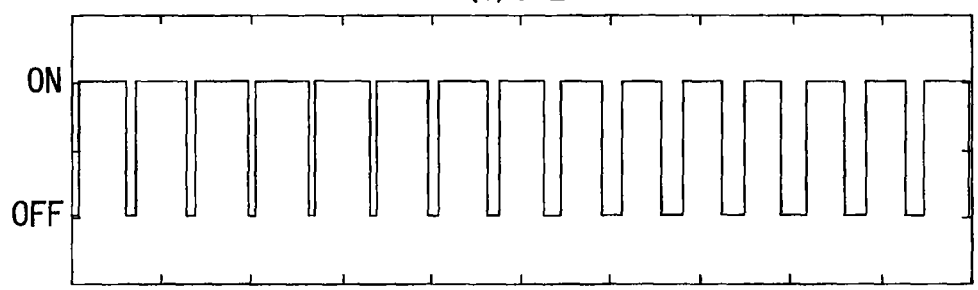
Figure 3:
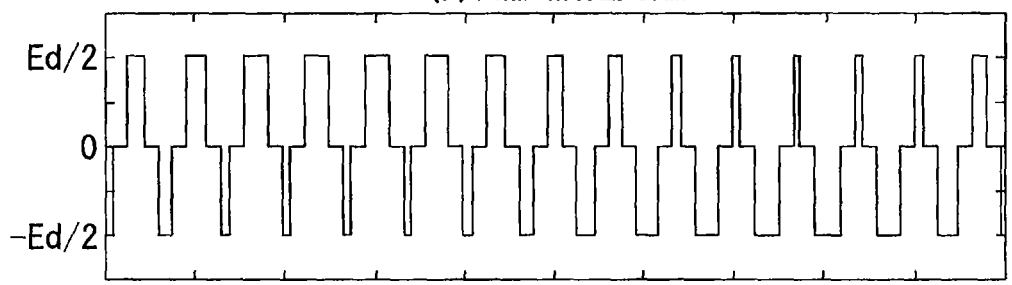

FIG. 3 is an explanation diagram showing an example in which PWM control by dipolar modulation is performed for the switching elements composing the main circuit 1, and here, shows an ideal state in which ON voltage drop does not occur. In the dipolar modulation, for example, in the case of obtaining U-phase output voltage, a U-phase switching command SU* is generated using a higher carrier shifted in a positive direction, a lower carrier shifted in a negative direction, and a U-phase modulation wave which is a reference signal wave, as shown in FIG. 3(A).

Specifically, as shown in FIG. 3(B), based on the magnitude relationship between the higher carrier and the U-phase modulation wave, ON/OFF control is performed for the switching element SU1, and as shown in FIG. 3(C), based on the magnitude relationship between the lower carrier and the U-phase modulation wave, ON/OFF control is performed for the switching element SU2. Although not shown, the switching element SU3 performs an operation inverted from the switching element SU1, and the switching element SU4 performs an operation inverted from the switching element SU2. Thus, in the case of performing dipolar modulation with a 3-level inverter, a PWM waveform shown in FIG. 3(D), that is, a waveform in which positive and negative voltage pulses are alternately outputted via zero voltage within a half cycle of the U-phase modulation wave, is obtained.

Here, a ratio between a shift amount B by which the two carrier waveforms are respectively shifted in positive and negative directions and an amplitude C of each carrier waveform is referred to as a dipolar rate D. In this case, the dipolar rate D is defined as {shift amount B/carrier waveform amplitude C}. For example, in the exemplary case shown in FIG. 3(A), the dipolar rate is D=0.5/1=0.5. The dipolar rate D indicates an offset amount from a zero level of the carrier. By adjusting the dipolar rate D, it is possible to adjust output time of zero voltage, whereby current ripple in the case of outputting low voltage can be reduced as compared to a 2-level inverter.

In light of the above, next, operation of the control section 9 will be described. Here, the case where, among the U, V, and W phases, a U-phase switching command SU* is outputted will be described.

First, a multiplier 91 multiplies the DC voltage Ed between P and N detected by the voltage detection section 6, by 0.5, to calculate half voltage Ed/2. Here, for calculation of the half voltage Ed/2, a method of detecting voltages of FC1 and FC2 and averaging them may be used. In addition, a divider 92 divides a U-phase voltage command value VU* by the half voltage Ed/2, to calculate a U-phase modulation wave a which indicates a ratio between the voltage command value and the DC voltage.

An ON voltage calculation circuit 93 calculates and outputs ON voltage error $\Delta V_{ON}$ caused due to ON voltage drop when current flows in each switching element and each flyback diode of the U-phase arm, based on the U-phase modulation wave a, the dipolar rate D, and the U-phase current IU. A calculation method for the ON voltage error $\Delta V_{ON}$ will be described later in detail. Next, a divider 94 divides the ON voltage error $\Delta V_{ON}$ by the half voltage Ed/2 to convert the ON voltage error $\Delta V_{ON}$ to a modulation rate which indicates the ratio between a voltage command value and the DC voltage and is used as an ON voltage correction amount. Subsequently, a subtractor 95 corrects the U-phase modulation wave a outputted from the divider 92 by the ON voltage correction amount.

A carrier generator 96 receives the dipolar rate D, and generates and outputs a higher carrier and a lower carrier to a PWM calculator 97. As shown in FIG. 3, the PWM calculator 97 generates a switching command SU1* for controlling the switching element SU1, based on the magnitude relationship between the higher carrier and a U-phase modulation wave ah for which the ON voltage drop has been compensated, and generates a switching command SU2* for controlling the switching element SU2, based on the magnitude relationship between the lower carrier and the U-phase modulation wave ah for which the ON voltage error has been corrected.

An inversion logic device 98 inverts the switching command SU1* to generate the switching command SU3* for controlling the switching element SU3, and inverts the switching command SU2* to generate the switching command SU4* for controlling the switching element SU4. Receiving the switching commands SU1* to SU4*, a gate logic device 99 secures a minimum ON/OFF time, sets a dead time period for preventing element short-circuit, and performs dead time correction for correcting output voltage error due to the setting of the dead time period. Then, the gate logic device 99 outputs a U-phase switching command SU* to the main circuit 1 via a gate driver (not shown). Similarly, the control section 9 has the same function also for V phase and W phase, and outputs a V-phase switching command SV* and a W-phase switching command SW* to the main circuit 1.

Due to ON voltage drop when current flows in each switching element and each flyback diode composing the main circuit 1, actual voltage applied to the load 8 has error from an initial voltage command. Here, with reference to FIG. 3 and FIG. 4, a generation principle of ON voltage error due to the ON voltage drop in the main circuit 1 will be described.

Figure 4:
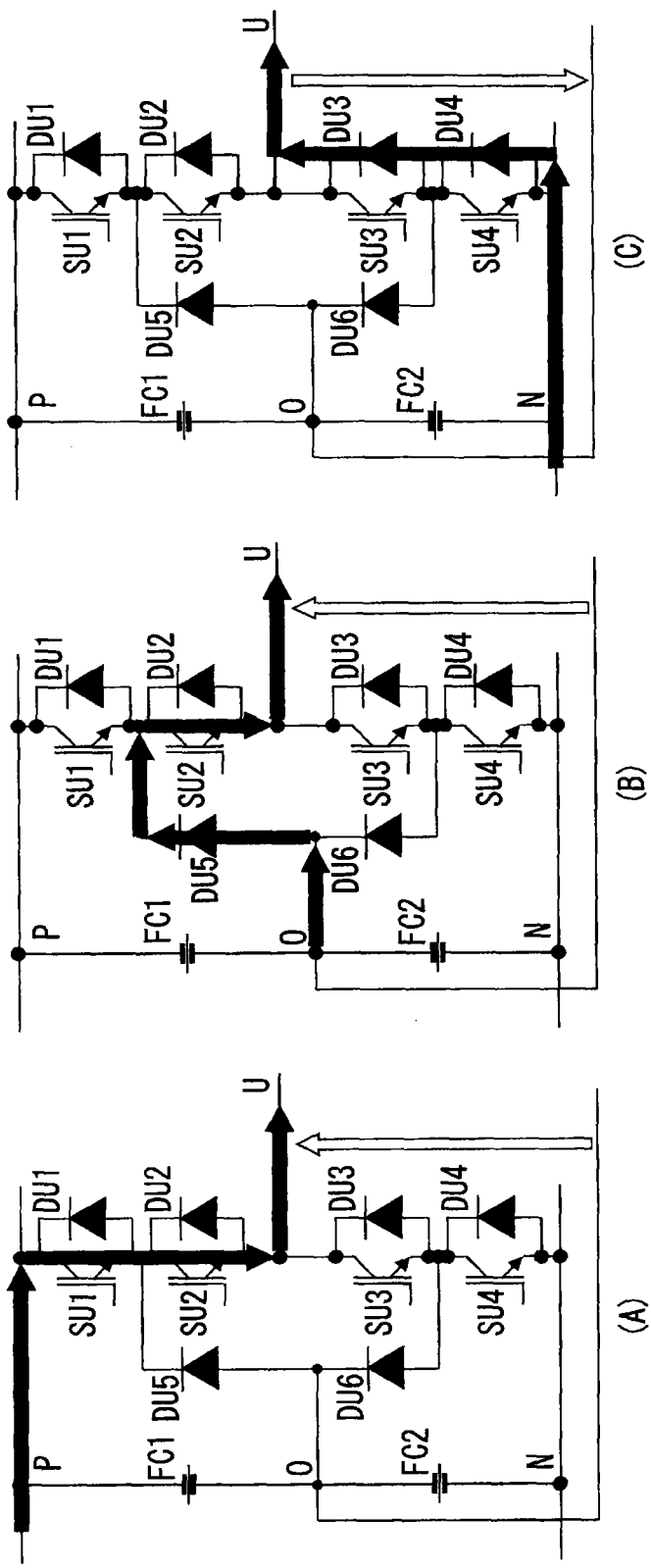
FIG. 4 is an explanation diagram of a generation principle of ON voltage error due to ON voltage drop in the 3-level power conversion circuit of the power conversion device.

FIG. 3 and FIG. 4 show a U-phase switching arm part of the main circuit 1. In the figures, a filled arrow indicates a route and a direction in which U-phase current IU flows, and an outline arrow indicates a direction of voltage $V_{UO}$ between U phase and a neutral point O.

FIG. 4(A) shows a state in which the switching elements SU1 and SU2 are turned on and the switching elements SU3 and SU4 are turned off to output a positive level (high potential) and U-phase current IU flows in a positive direction. At this time, if ON voltage at which current flows in each of the switching elements SU1 and SU2 is $V_{SON}$, the voltage $V_{UO}$ between U phase and the neutral point O is represented by the following (Expression 1).

$$V_{UO}=Ed/2-V_{SON}-V_{SON} \quad \text{(Expression 1)}$$

FIG. 4(B) shows a state in which the switching elements SU2 and SU3 are turned on and the switching elements SU1 and SU4 are turned off to output a zero level (intermediate potential) and U-phase current IU flows in a positive direction. At this time, if ON voltage at which current flows in a diode DU5 is $V_{DON}$, the voltage $V_{UO}$ between U phase and the neutral point O is represented by the following (Expression 2).

$$V_{UO}=0-V_{DON}-V_{SON} \quad \text{(Expression 2)}$$

FIG. 4(C) shows a state in which the switching elements SU3 and SU4 are turned on and the switching elements SU1 and SU2 are turned off to output a negative level (low potential) and U-phase current IU flows in a positive direction. At this time, the voltage $V_{u}o$ between U phase and the neutral point O is represented by the following (Expression 3).

$$V_{UO}=-Ed/2-V_{DON}-V_{DON} \quad \text{(Expression 3)}$$

FIG. 5(D) shows a state in which the switching elements SU1 and SU2 are turned on and the switching elements SU3 and SU4 are turned off to output a positive level (high potential) and U-phase current IU flows in a negative direction. At this time, the voltage $V_{UO}$ between U phase and the neutral point O is represented by the following (Expression 4).

$$V_{UO}=Ed/2+V_{DON}+V_{DON} \quad \text{(Expression 4)}$$

FIG. 5(E) shows a state in which the switching elements SU2 and SU3 are turned on and the switching elements SU1 and SU4 are turned off to output a zero level (intermediate potential) and U-phase current IU flows in a negative direction. At this time, the voltage $V_{UO}$ between U phase and the neutral point O is represented by the following (Expression 5).

$$V_{UO}=0V_{DON}+V_{SON} \quad \text{(Expression 5)}$$

FIG. 5(F) shows a state in which the switching elements SU3 and SU4 are turned on and the switching elements SU1 and SU2 are turned off to output a negative level (low potential) and U-phase current IU flows in a negative direction. At this time, the voltage $V_{UO}$ between U phase and the neutral point O is represented by the following (Expression 6).

$$V_{UO}=-Ed/2+V_{SON}+V_{SON} \quad \text{(Expression 6)}$$

Figure 5:
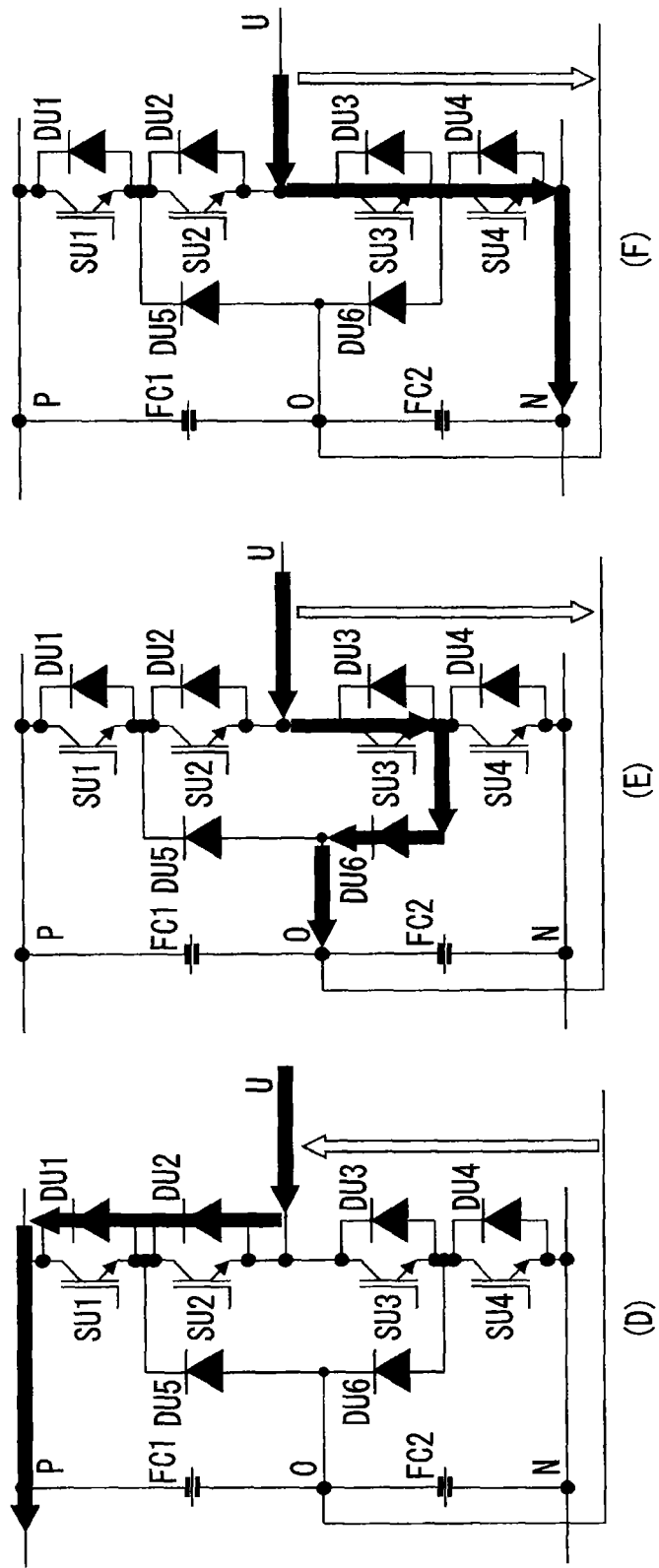
FIG. 5 is an explanation diagram of a generation principle of ON voltage error due to ON voltage drop in the 3-level power conversion circuit of the power conversion device.

As described above, as for the voltage $V_{UO}$ between U phase and the neutral point O of the main circuit 1 forming the 3-level inverter, although three voltage levels of Ed/2, 0, and −Ed/2 are generated in an ideal case where ON voltage drop does not occur, actually, the voltages $V_{UO}$ containing ON voltage errors represented by the six patterns (Expressions 1 to 6) of (A) to (F) in FIG. 4 and FIG. 5 due to ON voltage drop are generated.

Next, with reference to FIG. 6, FIG. 7, and FIG. 8, a principle of ON voltage correction which corrects ON voltage error caused due to ON voltage drop in a 3-level inverter will be described.

Figure 6:
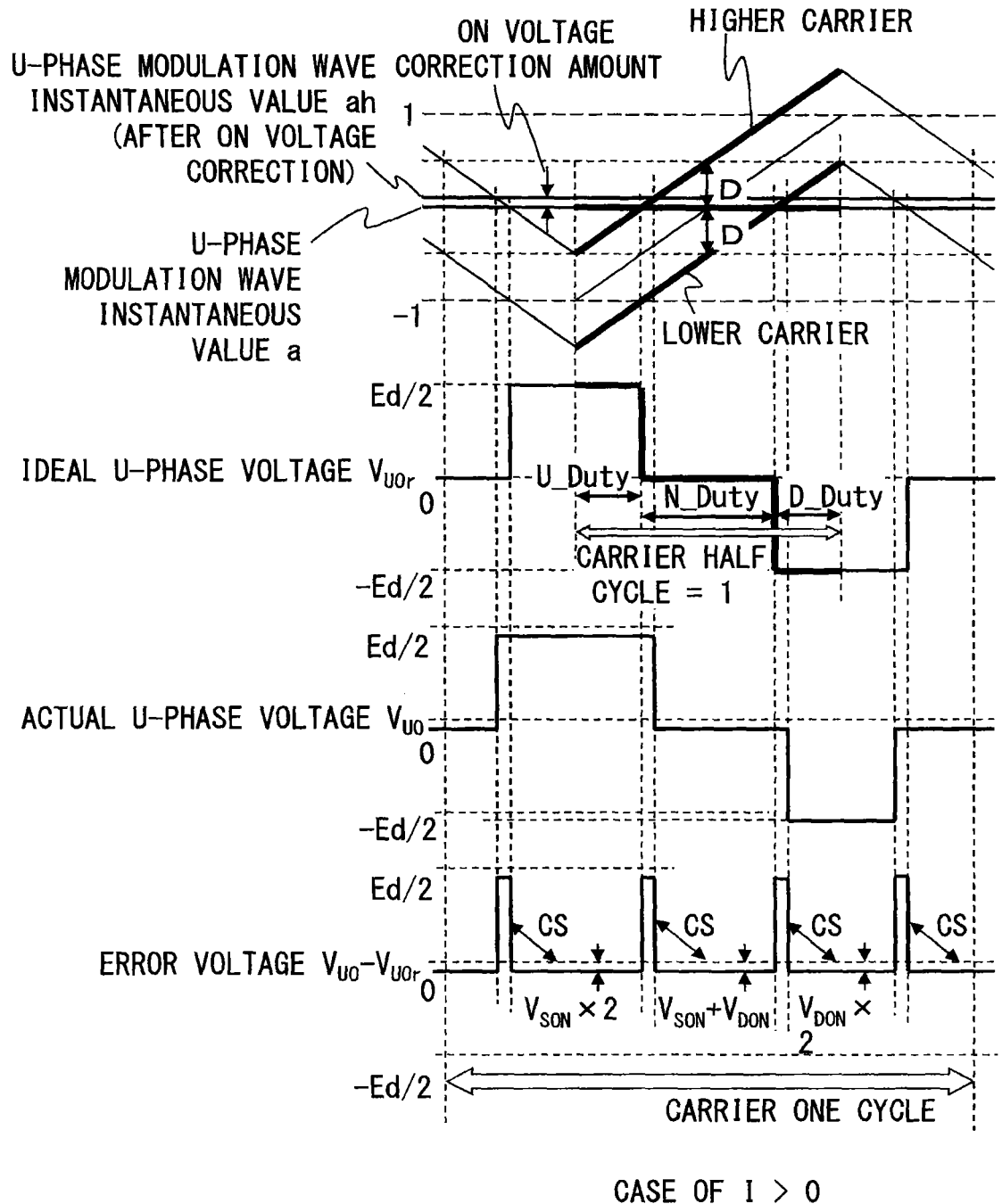
FIG. 6 is an explanation diagram of a principle of correction of ON voltage drop in the 3-level power conversion circuit of the power conversion device.
Figure 7:
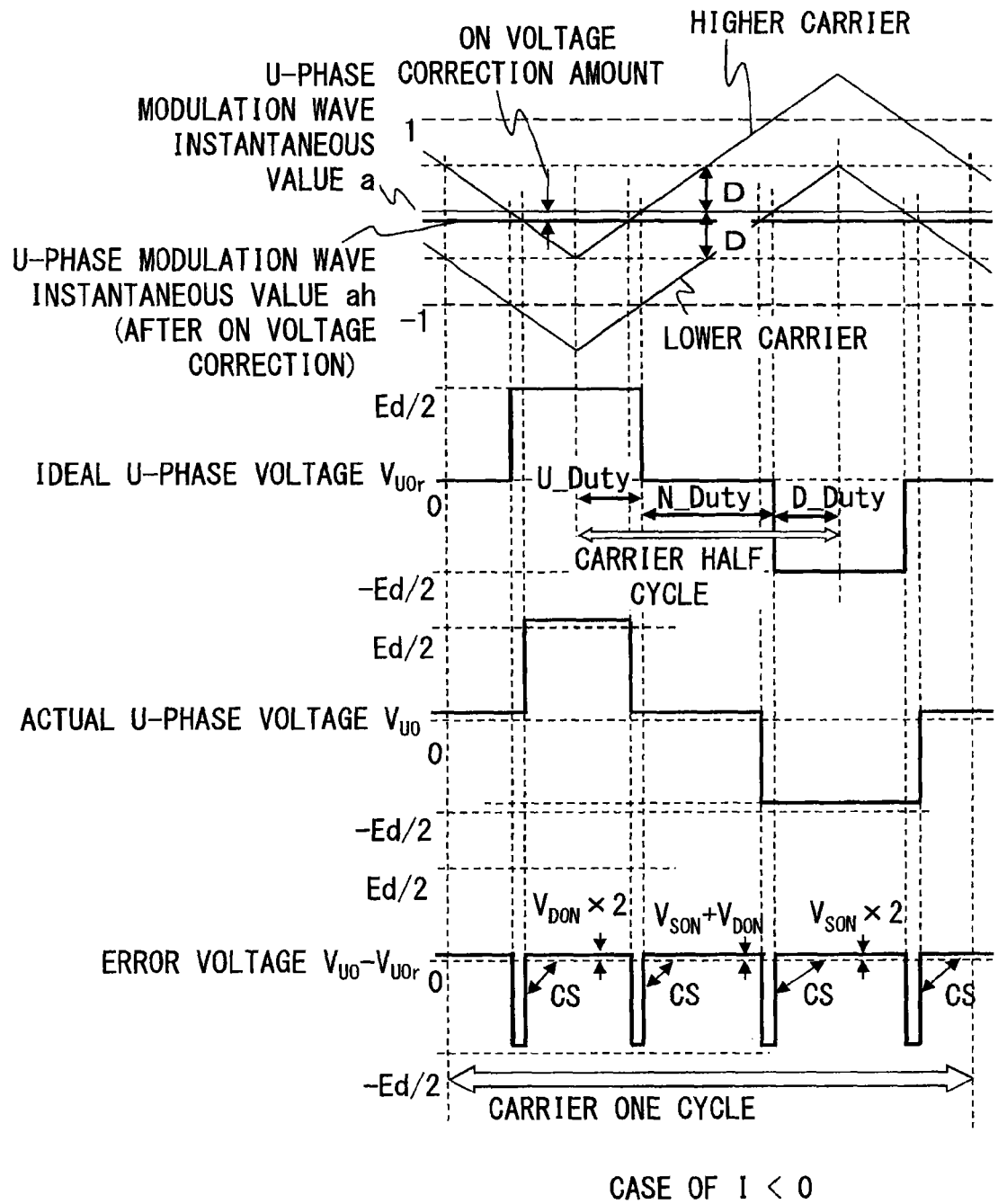
FIG. 7 is an explanation diagram of a principle of correction of ON voltage drop in the 3-level power conversion circuit of the power conversion device.
Figure 8:
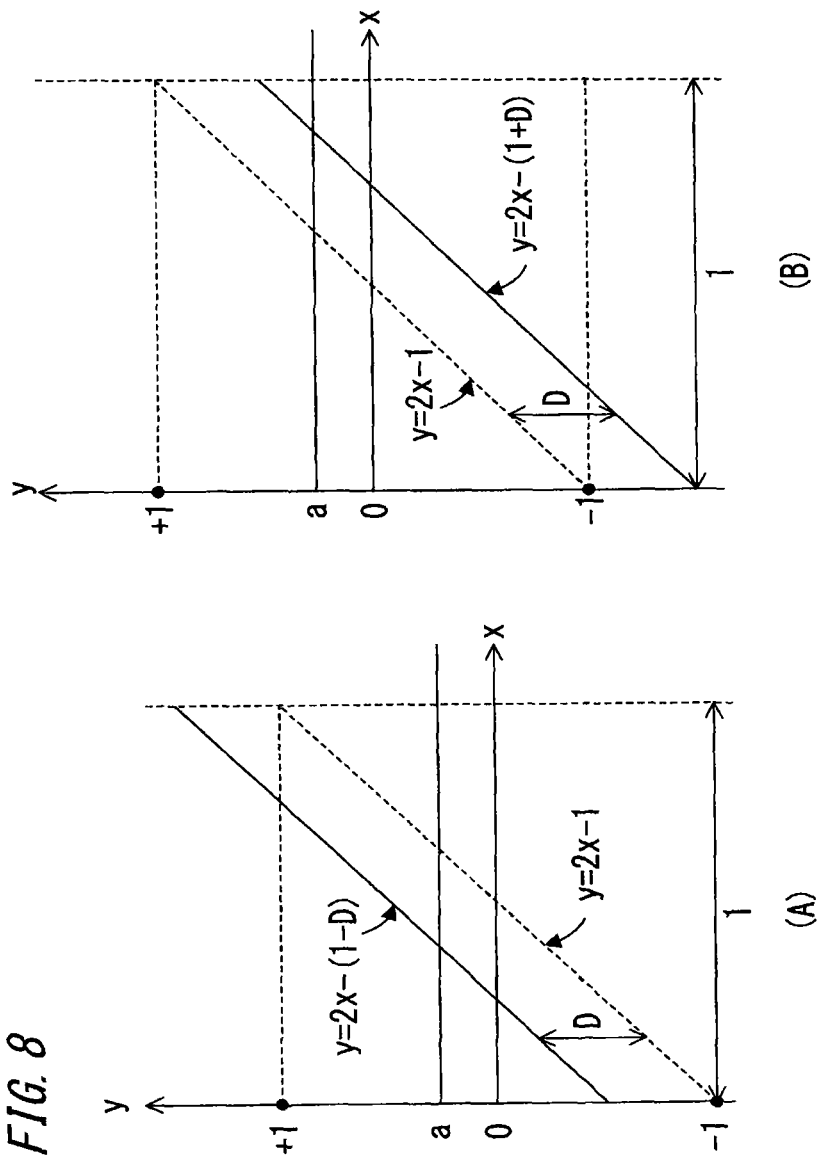
FIG. 8 is an explanation diagram of Duty calculation of phase voltage when ON voltage drop is corrected in dipolar modulation.

In FIG. 6 and FIG. 7, D denotes "dipolar rate D" and CS means "compensated with each other".

FIG. 6 is a principle diagram in the case (corresponding to FIG. 4(A) to (C)) where U-phase current IU flows in a positive direction, and FIG. 7 is a principle diagram in the case (corresponding to FIG. 5(D) to (F)) where U-phase current IU flows in a negative direction. Here, for convenience sake, one cycle of the carrier waveform will be described.

First, average error voltage $\Delta V_{ON}$ in a carrier half cycle will be derived.

As shown by a thick line part in FIG. 6, the length of the carrier half cycle is defined as "1", and in an ideal state, a period (time ratio) in which U-phase voltage $V_{UOr}$ is outputted at a positive level (high potential) is denoted by U_Duty, a period (time ratio) in which U-phase voltage $V_{UOr}$ is outputted at a zero level (intermediate potential) is denoted by N_Duty, and a period (time ratio) in which U-phase voltage $V_{UOr}$ is outputted at a negative level (low potential) is denoted by D_Duty. In this case, if U-phase current IU flows in a positive direction, the average error voltage $\Delta V_{ON}$ in the carrier half cycle is represented by the following (Expression 7), as found from error components included in the above (Expression 1) to (Expression 3).

$$\Delta V_{ON}=-\{2 \cdot V_{SON} \cdot U\_Duty+(V_{DON}+V_{SON}) \cdot N\_Duty+ 2 \cdot V_{DON} \cdot D\_Duty\} \quad \text{(Expression 7)}$$

If U-phase current IU flows in a negative direction, the average error voltage $\Delta V_{ON}$ in the carrier half cycle is represented by the following (Expression 8), as found from error components included in the above (Expression 4) to (Expression 6).

$$\Delta V_{ON}=2 \cdot V_{DON} \cdot U\_Duty+(V_{DON}+V_{SON}) \cdot N\_Duty+ 2 \cdot V_{SON} \cdot D\_Duty \quad \text{(Expression 8)}$$

U_Duty, N_Duty, and D_Duty in the above (Expression 7) and (Expression 8) can be calculated as the following (Expression 9), (Expression 10), and (Expression 11), using an instantaneous value a of the U-phase modulation wave and the dipolar rate D.

$$U\_Duty=0.5 \cdot (1+a-D) \quad \text{(Expression 9)}$$

$$N\_Duty=D \quad \text{(Expression 10)}$$

$$D\_Duty=0.5 \cdot (1-a-D) \quad \text{(Expression 11)}$$

The reason why the above (Expression 9), (Expression 10), and (Expression 11) can be obtained will be described with reference to FIG. 8.

As shown in FIG. 8(A), in the case where the length of the carrier half cycle is defined as "1", the higher carrier is represented by the following (Expression 50), using the dipolar rate D.

$$y=2x-(1-D) \quad \text{(Expression 50)}$$

In an ideal state, the period U_Duty in which U-phase phase voltage $V_{UOr}$ is outputted at a positive level (high potential) is a period in which the instantaneous value a of the U-phase modulation wave is greater than the higher carrier.

Substituting y=a and x=U_Duty in the above (Expression 50) obtains the following.

$$a = 2 \cdot U\_Duty - (1-D)$$

That is, $U\_Duty = 0.5(1 + a - D)$

Thus, (Expression 9) is obtained.

As shown in FIG. 8(B), in the case where the length of the carrier half cycle is defined as "1", the lower carrier is represented by the following (Expression 51), using the dipolar rate D.

$$y = 2x - (1+D) \quad \text{(Expression 51)}$$

In an ideal state, the period D_Duty in which U-phase voltage $V_{UOr}$ is outputted at a negative level (low potential) is a period in which the instantaneous value a of the U-phase modulation wave is smaller than the lower carrier. If a period in which the instantaneous value a of the U-phase modulation wave is greater than the lower carrier is xo, the following relationship is satisfied.

$$xo = 1 - D\_Duty$$

Therefore, substituting y=a and x=xo in (Expression 51) obtains the following.

$$a = 2 \cdot (1 - D\_Duty) - (1+D)$$

That is, $D\_Duty = 0.5(1 - a - D)$

Thus, (Expression 11) is obtained.

In an ideal state, the period N_Duty in which the U-phase voltage $V_{UOr}$ is outputted at a zero level (intermediate potential) has a relationship shown by the following (Expression 52) with U_Duty and D_Duty.

$$N\_Duty = 1 - U\_Duty - D\_Duty \quad \text{(Expression 52)}$$

Therefore, substituting (Expression 9) and (Expression 11) in (Expression 52) obtains the following.

$$N\_Duty = 1 - 0.5(1 + a - D) - 0.5(1 - a - D) = D$$

Thus, (Expression 10) is obtained.

Thus, in the case where the U-phase current IU flows in the positive direction, as described in FIG. 4(A), the average error voltage $\Delta V_{ON}$ is calculated based on (Expression 7) and divided by Ed/2 to be converted into a modulation rate, the instantaneous value a of the U-phase modulation wave is corrected using the modulation rate as an ON voltage correction amount, and then PWM is generated using the corrected instantaneous value ah of the U-phase modulation wave, whereby voltage according to the actual U-phase voltage $V_{UO}$ is outputted from the main circuit 1. Thus, positive and negative values of the error voltage ($V_{UO}$-$V_{UOr}$) are compensated with each other, whereby the ON voltage error can be corrected so that the average value of the error voltage ($V_{UO}$-$V_{UOr}$) becomes zero.

Also in the case where the U-phase current IU flows in a negative direction, as described in FIG. 7, by the same principle, the average error voltage $\Delta V_{ON}$ is calculated based on (Expression 8) and divided by Ed/2 to be converted into a modulation rate, the instantaneous value a of the U-phase modulation wave is corrected using the modulation rate as an ON voltage correction amount, and then PWM is generated using the corrected instantaneous value ah of the U-phase modulation wave, whereby the ON voltage error can be corrected.

The principle diagrams shown in FIG. 6 and FIG. 7 are for explanation for only U phase. However, also for V phase and W phase, ON voltage correction can be performed by the same principle.

Next, specific configuration and operation of the ON voltage calculation circuit 93 which calculates average error voltage $\Delta V_{ON}$ for performing ON voltage correction will be described with reference to FIG. 9.

The ON voltage calculation circuit 93 receives the instantaneous value a of the U-phase modulation wave and dipolar rate D and performs calculations based on (Expression 9), (Expression 10), and (Expression 11) by a Duty calculation circuit 931, thereby outputting U_Duty, N_Duty, and D_Duty. An element ON voltage calculation circuit 932 receives the U-phase current IU detected by the current detection section 7U, and calculates and outputs ON voltage $V_{SON}$ of the switching elements SU1 to SU4 and ON voltage $V_{DON}$ of the diodes DU1 to DU4 based on the U-phase current IU. Receiving these values, a positive-side calculation circuit 933 calculates and outputs average error voltage $\Delta V_{ON}$ in the case where the U-phase current IU flows in a positive direction, based on the above (Expression 7), and a negative-side calculation circuit 934 calculates and outputs average error voltage $\Delta V_{ON}$ in the case where the U-phase current IU flows in a negative direction, based on the above (Expression 8). An output selection circuit 935 receives calculation results from the calculation circuits 933 and 934 and selects and outputs average error voltage $\Delta V_{ON}$ according to the polarity of the U-phase current IU.

Generally, ON voltage of a semiconductor element changes with change in current flowing in the element and change in the temperature of the element. Therefore, the element ON voltage calculation circuit 932 takes this into consideration to calculate ON voltage $V_{SON}$ of the switching elements SU1 to SU4 and ON voltage $V_{DON}$ of the diodes DU1 to DU4 in response to the U-phase current IU. Specifically, ON voltage characteristics of ON voltage $V_{SON}$ of the switching elements SU1 to SU4 and ON voltage $V_{DON}$ of the diodes DU1 to DU4 may be measured taking the element temperature into consideration and approximate expressions thereof may be derived and used for the calculation of ON voltage. Alternatively, the ON voltage characteristics may be stored as a table and ON voltage may be derived by referring to the table. Thus, the ON voltages $V_{SON}$ and $V_{DON}$ can be derived more accurately.

In the configuration shown in FIG. 1 and FIG. 2, the voltage command value and the average error voltage $\Delta V_{ON}$ are each divided by Ed/2 to be converted into a modulation rate, and then the modulation rate is corrected by the subtractor 95. However, the voltage command value, e.g., VU* may be directly corrected with the average error voltage $\Delta V_{ON}$ and then divided by Ed/2 to obtain the U-phase modulation wave a, and the obtained U-phase modulation wave a may be given to the PWM calculator 97.

As described above, according to embodiment 1, average error voltage $\Delta V_{ON}$ in the case where dipolar modulation is performed in PWM control of the 3-level inverter is calculated by the ON voltage calculation circuit 93, whereby ON voltage drop when current flows in the switching element or the flyback diode can be accurately compensated. Therefore, in PWM control of the 3-level inverter, even in the case where the load 8 is driven using dipolar modulation, ON voltage correction can be performed appropriately, whereby accuracy of output voltage of the 3-level inverter can be enhanced.

Embodiment 2

The above embodiment 1 has described that average error voltage $\Delta V_{ON}$ in the case of dipolar modulation can be calculated using (Expression 7), (Expression 8), (Expression 9), (Expression 10), and (Expression 11). Here, if (Expression 9), (Expression 10), and (Expression 11) are substituted in (Expression 7) and (Expression 8) and the resultant expressions are arranged, average error voltage $\Delta V_{ON}$ in the case where the U-phase current IU flows in a positive direction can be derived as shown by the following (Expression 12) and average error voltage $\Delta V_{ON}$ in the case where the U-phase current IU flows in a negative direction can be derived as shown by the following (Expression 13).

$$\Delta V_{ON} = -\{(1+a) \cdot V_{SON} + (1-a) \cdot V_{DON}\} \quad \text{(Expression 12)}$$

$$\Delta V_{ON} = (1+a) \cdot V_{DON} + (1-a) \cdot V_{SON} \quad \text{(Expression 13)}$$

Figure 10:
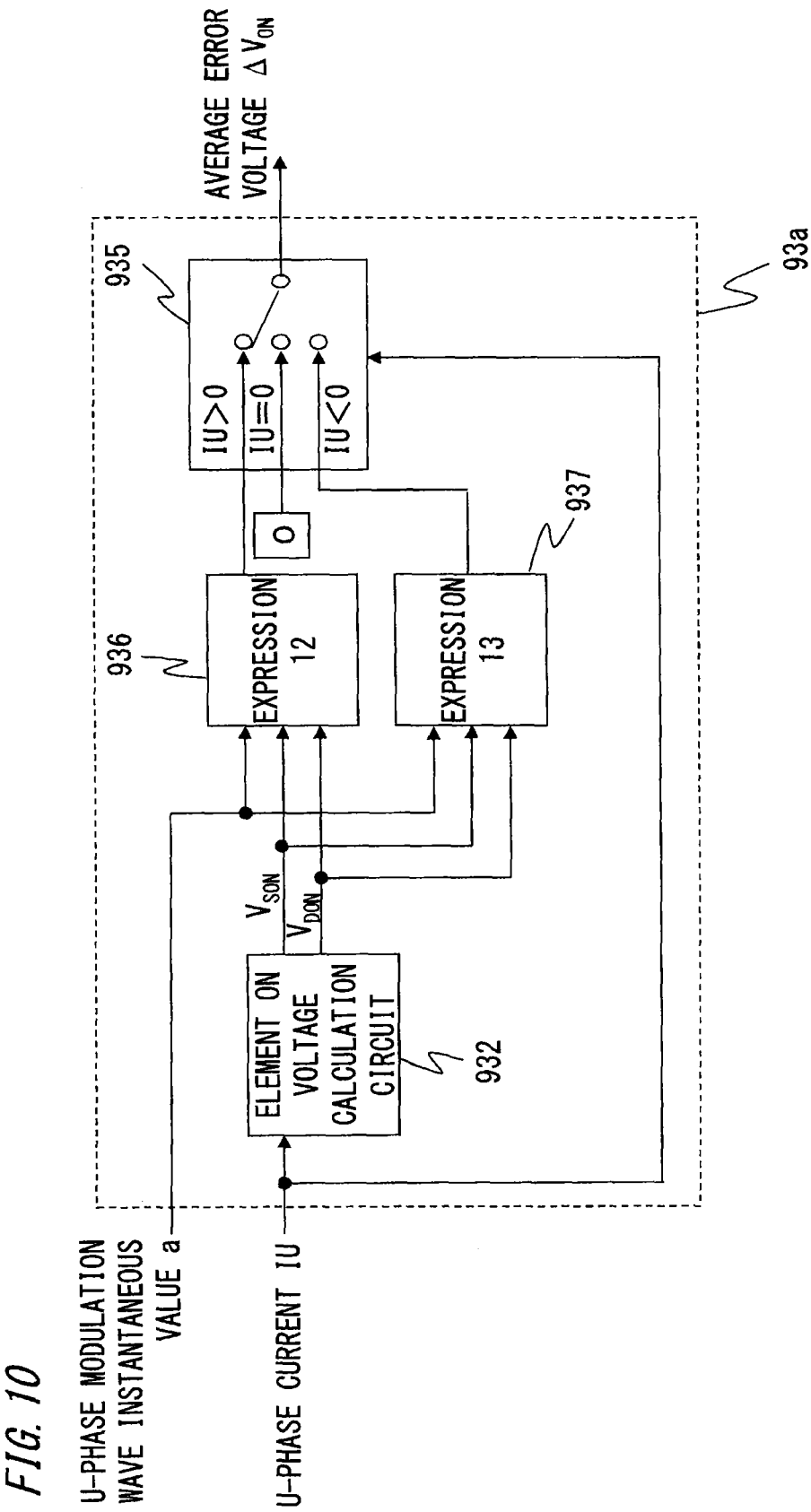
FIG. 10 is a configuration diagram of an ON voltage calculation circuit composing a control section which controls a 3-level power conversion circuit of a power conversion device according to embodiment 2 of the present invention.

The above (Expression 12) and (Expression 13) for calculating the average error voltage $\Delta V_{ON}$ become simple expressions not containing the dipolar rate D. Therefore, in the present embodiment 2, an ON voltage calculation circuit 93a which calculates average error voltage $\Delta V_{ON}$ for performing ON voltage correction is configured as shown in FIG. 10. The other components are the same as in the above embodiment 1 (FIG. 1 and FIG. 2), so the detailed description thereof is omitted here.

Figure 9:
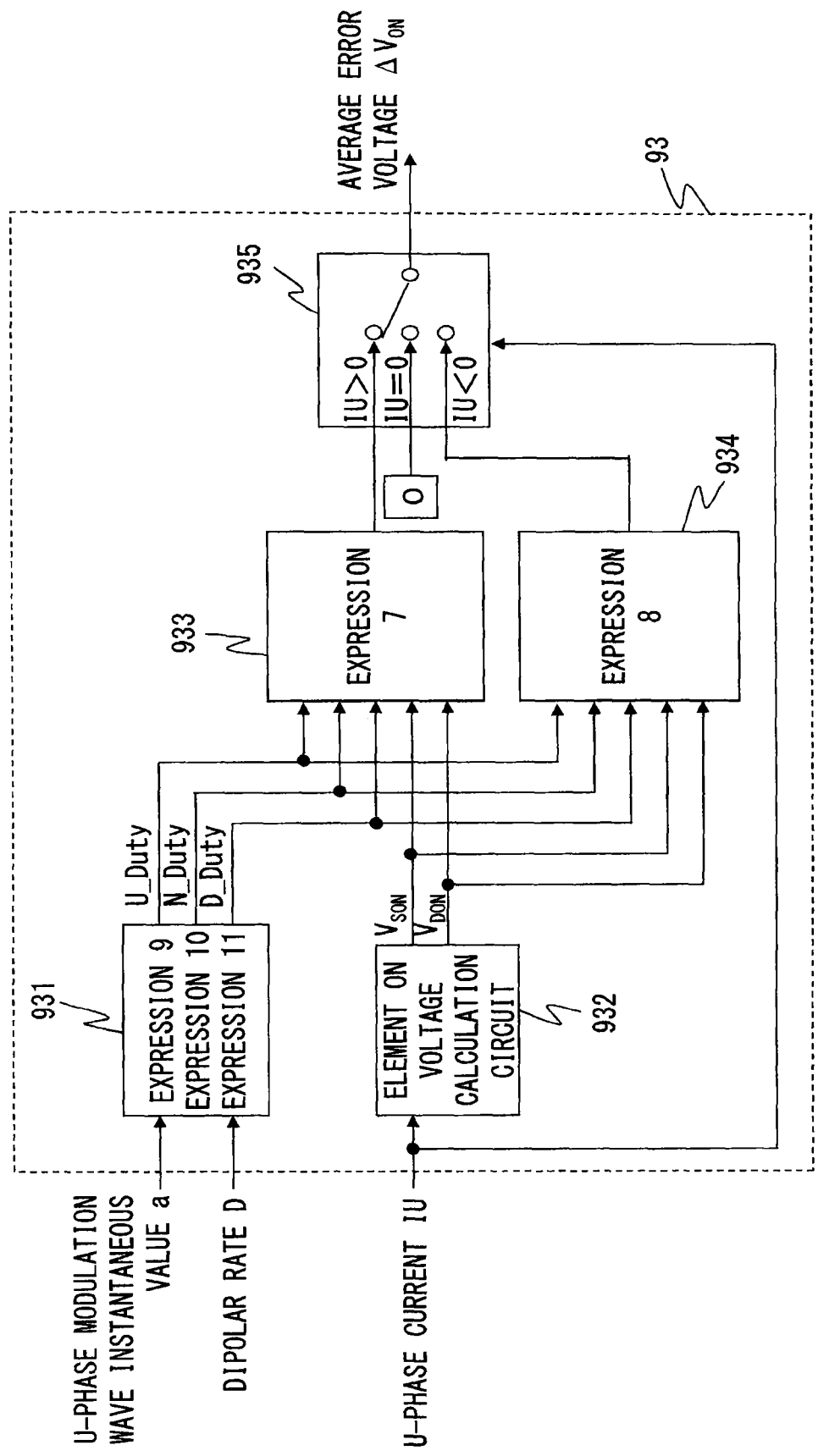
FIG. 9 is a configuration diagram of an ON voltage calculation circuit composing a control section which controls the 3-level power conversion circuit of the power conversion device.

The ON voltage calculation circuit 93a of embodiment 2 is modified such that, instead of using (Expression 7) in the positive-side calculation circuit 933 configured as shown in FIG. 9, (Expression 12) is used in a positive-side calculation circuit 936 to calculate average error voltage $\Delta V_{ON}$, and instead of using (Expression 8) in the negative-side calculation circuit 934 configured as shown in FIG. 9, (Expression 13) is used in a negative-side calculation circuit 937 to calculate average error voltage $\Delta V_{ON}$. The Duty calculation circuit 931, which is no longer necessary, is removed. The other components and operation of the ON voltage calculation circuit 93a are the same as those shown in FIG. 9 in embodiment 1. Therefore, the corresponding components are denoted by the same reference characters and the description thereof is omitted.

As described above, in embodiment 2, the ON voltage calculation circuit 93a is configured as shown in FIG. 10, thereby not only allowing appropriate ON voltage correction as in embodiment 1 but also simplifying the configuration as compared to embodiment 1, resulting in reduction in the calculation amount.

Embodiment 3

In the above embodiments 1 and 2, ON voltage correction in the case where dipolar modulation is performed in PWM control of a 3-level inverter has been described. In the present embodiment 3, ON voltage correction in the case where unipolar modulation is performed in PWM control of a 3-level inverter will be described.

Figure 11:
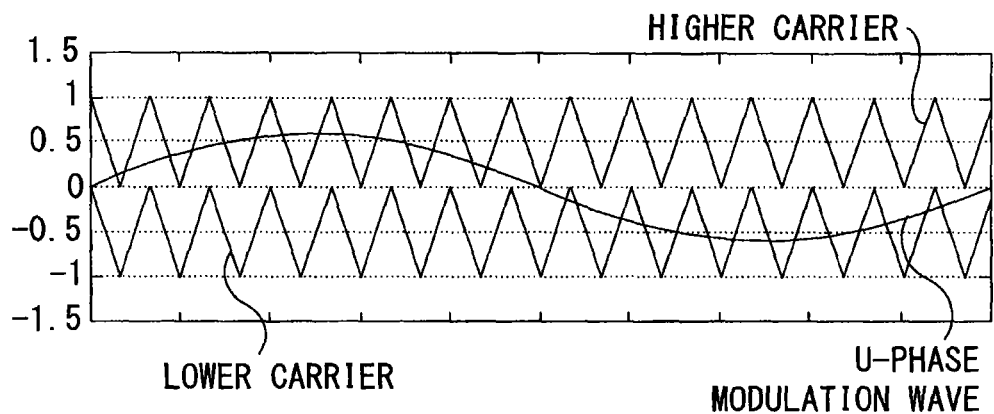
FIG. 11 is an explanation diagram showing an example in which PWM control by unipolar modulation is performed for semiconductor switching elements composing a 3-level power conversion circuit of a power conversion device.
Figure 11:
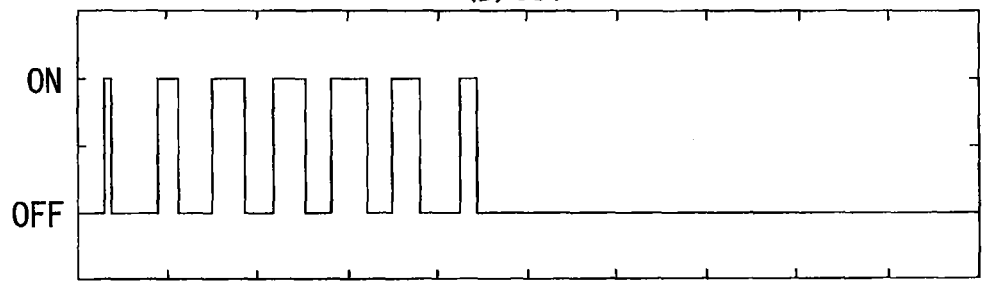
Figure 11:
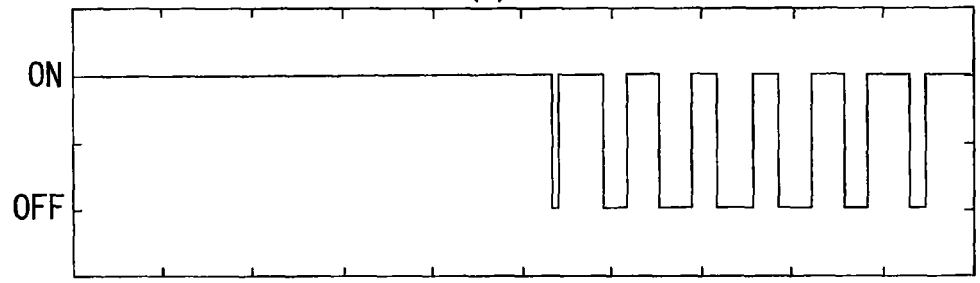
Figure 11:
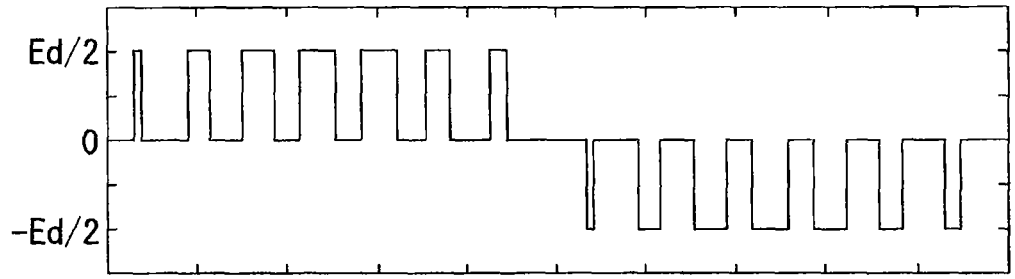

FIG. 11 is an explanation diagram showing an example in which PWM control by unipolar modulation is performed for switching elements, and here, shows an ideal state in which ON voltage drop does not occur. In the unipolar modulation, for example, in the case of obtaining U-phase output voltage, a U-phase switching command SU* is generated using a higher carrier shifted in a positive direction, a lower carrier shifted in a negative direction, and a U-phase modulation wave which is a reference signal wave, as shown in FIG. 11(A).

Specifically, as shown in FIG. 11(B), based on the magnitude relationship between the higher carrier and the U-phase modulation wave, ON/OFF control is performed for the switching element SU1, and as shown in FIG. 11(C), based on the magnitude relationship between the lower carrier and the U-phase modulation wave, ON/OFF control is performed for the switching element SU2. Although not shown, the switching element SU3 performs an operation inverted from the switching element SU1, and the switching element SU4 performs an operation inverted from the switching element SU2. Thus, in the case of performing unipolar modulation with a 3-level inverter, a PWM waveform shown in FIG. 11(D), that is, a waveform in which voltage pulses having a single polarity are outputted within a half cycle of the U-phase modulation wave, is obtained.

Also in the case of performing unipolar modulation, a generation principle of ON voltage error is the same as in the dipolar modulation shown in FIG. 4 and FIG. 5. Therefore, the above (Expression 7) and (Expression 8) can be applied for average error voltage $\Delta V_{ON}$ in a carrier half cycle.

Figure 12:
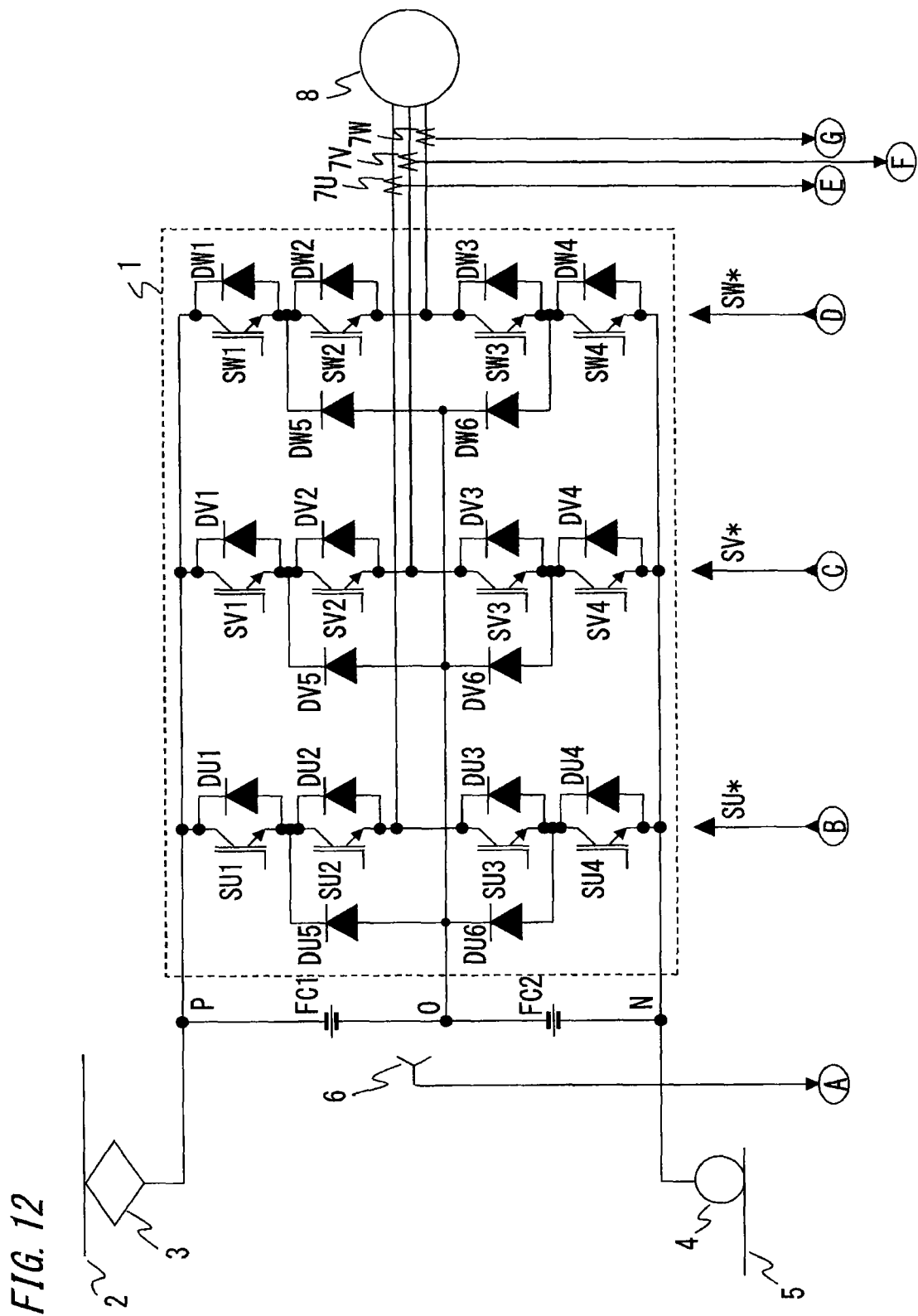
FIG. 12 is a configuration diagram of the power conversion device according to embodiment 3 of the present invention.
Figure 13:
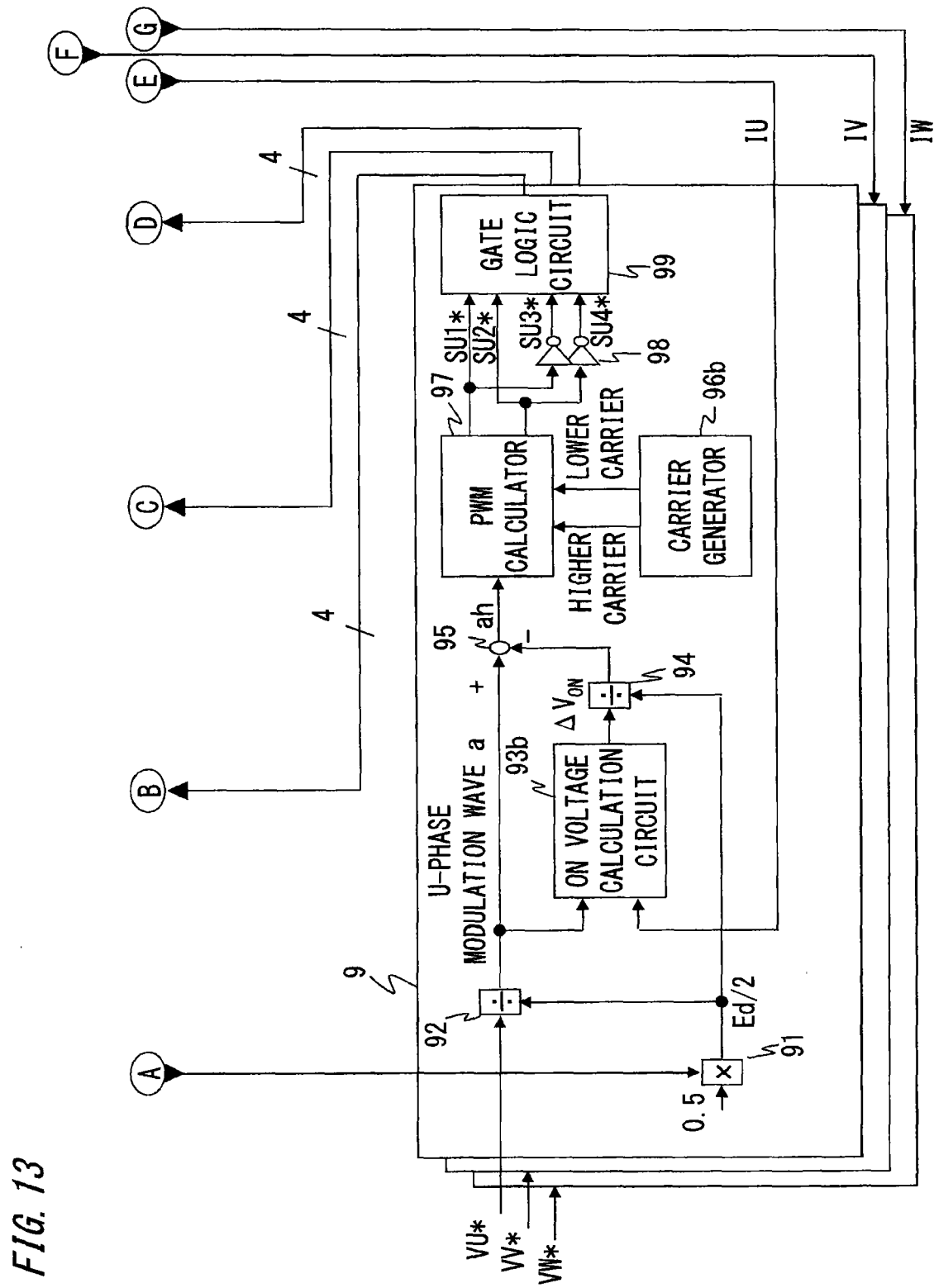
FIG. 13 is a configuration diagram of the power conversion device according to embodiment 3 of the present invention.

FIG. 12 and FIG. 13 are configuration diagrams of a power conversion device according to embodiment 3 of the present invention.

A feature of the power conversion device of embodiment 3 is that the configurations of an ON voltage calculation circuit 93b and a carrier generator 96b are different from the configuration (FIG. 1 and FIG. 2) of the power conversion device of the above embodiment 1. The other configurations are the same as in embodiment 1, so the description thereof is omitted.

In embodiment 3, the carrier generator 96b generates a higher carrier shifted in a positive direction and a lower carrier shifted in a negative direction shown in FIG. 11(A), and outputs them to the PWM calculator 97. The configuration and operation of the ON voltage calculation circuit 93b will be described later in detail.

Figure 14:
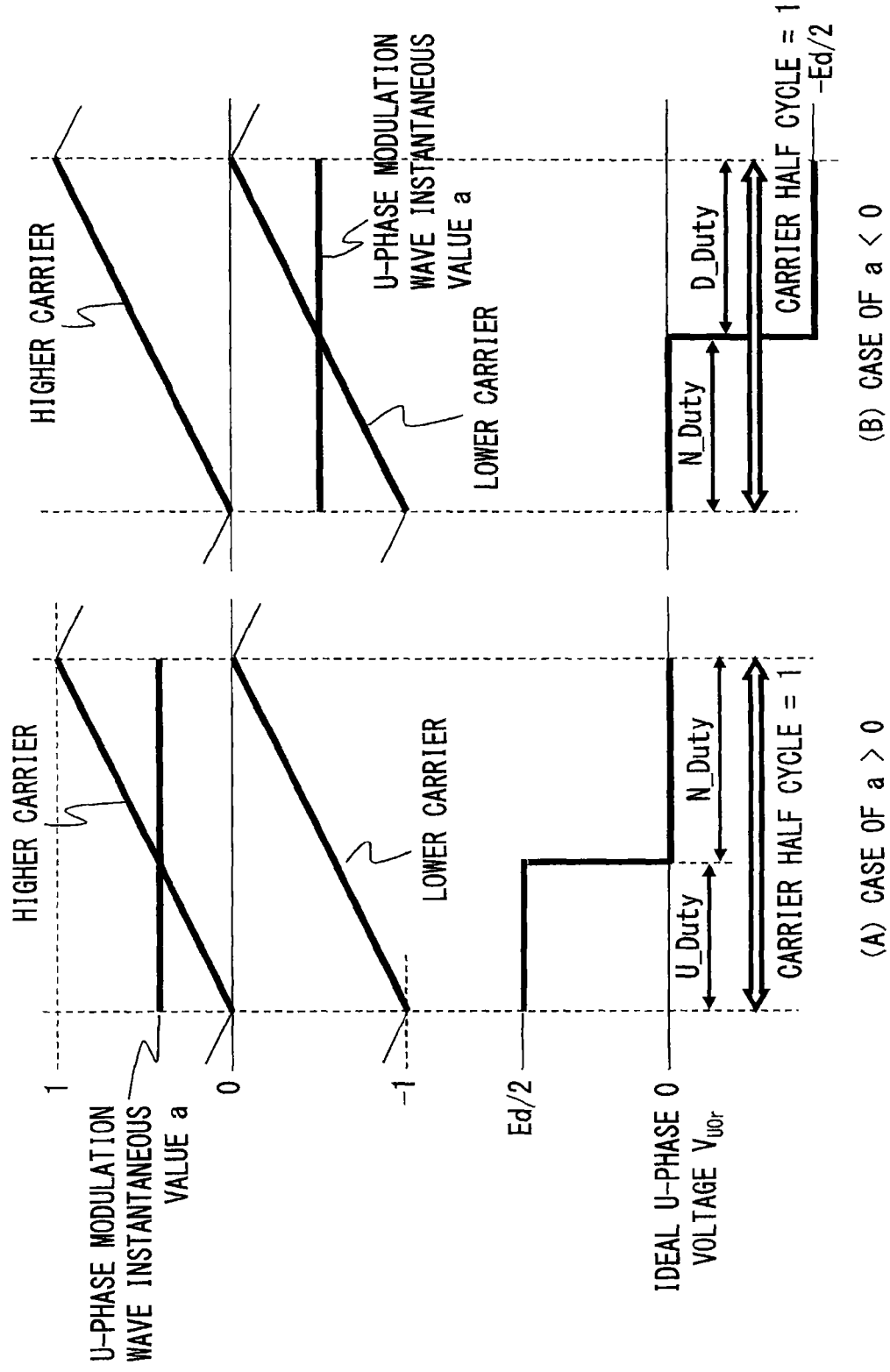
FIG. 14 is an explanation diagram of Duty calculation of phase voltage when ON voltage drop is corrected in unipolar modulation.

FIG. 14 is an explanation diagram of Duty calculation of U-phase voltage $V_{UOr}$ in an ideal state in unipolar modulation, and here, shows a half cycle of the carrier waveform.

First, the relationship of each duty in the case of performing unipolar modulation will be described. Here, the length of carrier half cycle is defined as 1, and in an ideal state, a period (time ratio) in which U-phase voltage $V_{UOr}$ is outputted at a positive level (high potential) is denoted by U_Duty, a period (time ratio) in which U-phase voltage $V_{UOr}$ is outputted at a zero level (intermediate potential) is denoted by N_Duty, and a period (time ratio) in which U-phase voltage $V_{UOr}$ is outputted at a negative level (low potential) is denoted by D_Duty.

FIG. 14(A) shows the relationship among a higher carrier, a lower carrier, the instantaneous value a of the U-phase modulation wave, and the U-phase voltage $V_{UOr}$ in an ideal state in the case where the instantaneous value a of the U-phase modulation wave is zero or greater (a>0). From this, it is found that each Duty of U-phase voltage $V_{UOr}$ in the case where the instantaneous value a of the U-phase modulation wave is zero or greater (a≥0) is represented by the following (Expression 14), (Expression 15), and (Expression 16).

$$U\_Duty = a \quad \text{(Expression 14)}$$

$$N\_Duty = 1-a \quad \text{(Expression 15)}$$

$$D\_Duty = 0 \quad \text{(Expression 16)}$$

FIG. 14(B) shows the relationship among a higher carrier, a lower carrier, the instantaneous value a of the U-phase modulation wave, and the U-phase voltage $V_{UOr}$ in an ideal state in the case where the instantaneous value a of the U-phase modulation wave is smaller than zero (a<0). From this, it is found that each Duty of U-phase voltage $V_{UOr}$ in the case where the instantaneous value a of the U-phase modulation wave is smaller than zero (a<0) is represented by the following (Expression 17), (Expression 18), and (Expression 19).

$$U\_Duty=0 \quad \text{(Expression 17)}$$

$$N\_Duty=1+a \quad \text{(Expression 18)}$$

$$D\_Duty=-a \quad \text{(Expression 19)}$$

If the above derived expressions of (Expression 14) to (Expression 19) for calculating each Duty are substituted in (Expression 7) and (Expression 8), the respective average error voltages $\Delta V_{ON}$ in a carrier half cycle in unipolar modulation can be derived.

Next, specific configuration and operation of the ON voltage calculation circuit 93b which calculates average error voltage $\Delta V_{ON}$ for performing ON voltage correction will be described with reference to FIG. 15.

The ON voltage calculation circuit 93b of embodiment 3 is different from the ON voltage calculation circuit 93 described in the above embodiment 1 (FIG. 9) in that Duty calculation circuits 931a and 931b and a Duty selection circuit 938 are provided. The other components and operation are the same as in embodiment 1 (FIG. 9).

Therefore, the corresponding components are denoted by the same reference characters and the description thereof is omitted.

Here, one Duty calculation circuit 931a, when receiving the instantaneous value a of the U-phase modulation wave, calculates U_Duty, D_Duty, and N_Duty based on the above (Expression 14) to (Expression 16), respectively. The other Duty calculation circuit 931b, when receiving the instantaneous value a of the U-phase modulation wave, calculates U_Duty, D_Duty, and N_Duty based on the above (Expression 17) to (Expression 19), respectively.

When the instantaneous value a of the U-phase modulation wave is zero or greater (a≥0), the Duty selection circuit 938 selects and outputs the output of the one Duty calculation circuit 931a, and when the instantaneous value a of the U-phase modulation wave is smaller than zero (a<0), selects and outputs the output of the other Duty calculation circuit 931b.

As described above, according to embodiment 3, average error voltage $\Delta V_{ON}$ in the case where unipolar modulation is performed in PWM control of the 3-level inverter is calculated by the ON voltage calculation circuit 93b, whereby ON voltage drop when current flows in each switching element or each flyback diode can be accurately compensated. Therefore, in PWM control of the 3-level inverter, even in the case where the load 8 is driven using unipolar modulation, ON voltage correction can be performed appropriately, whereby accuracy of output voltage of the 3-level inverter can be enhanced.

Embodiment 4

The above embodiment 3 has described that average error voltage $\Delta V_{ON}$ in the case of unipolar modulation can be calculated using (Expression 7), (Expression 8), and (Expression 14) to (Expression 19).

Here, the above (Expression 7) is applied to the case where the U-phase current IU flows in a positive direction, and the above (Expression 8) is applied to the case where the U-phase current IU flows in a negative direction. (Expression 14), (Expression 15), and (Expression 16) for calculating each Duty are applied to the case where the instantaneous value a of the U-phase modulation wave is zero or greater (a≥0), and (Expression 17), (Expression 18), and (Expression 19) for calculating each Duty are applied to the case where the instantaneous value a of the U-phase modulation wave is smaller than zero (a<0).

Therefore, if (Expression 14), (Expression 15), and (Expression 16) are substituted in (Expression 7) and the resultant expression is arranged, average error voltage $\Delta V_{ON}$ in the case where the instantaneous value a of the U-phase modulation wave is zero or greater (a≥0) and the U-phase current IU flows in a positive direction can be derived as shown by the following (Expression 20).

$$\Delta V_{ON}=-\{(1+a)\cdot V_{SON}+(1-a)\cdot V_{DON}\} \quad \text{(Expression 20)}$$

In addition, if (Expression 17), (Expression 18), and (Expression 19) are substituted in the above (Expression 7) and the resultant expression is arranged, average error voltage $\Delta V_{ON}$ in the case where the instantaneous value a of the U-phase modulation wave is smaller than zero (a<0) and the U-phase current IU flows in a positive direction can be derived as shown by the following (Expression 21).

$$\Delta V_{ON}=-\{(1+a)\cdot V_{SON}+(1-a)\cdot V_{DON}\} \quad \text{(Expression 21)}$$

Further, if (Expression 14), (Expression 15), and (Expression 16) are substituted in the above (Expression 8) and the resultant expression is arranged, average error voltage $\Delta V_{ON}$ in the case where the instantaneous value a of the U-phase modulation wave is zero or greater (a≥0) and the U-phase current IU flows in a negative direction can be derived as shown by the following (Expression 22).

$$\Delta V_{ON}=(1+a)\cdot V_{DON}+(1-a)\cdot V_{SON} \quad \text{(Expression 22)}$$

Finally, if (Expression 17), (Expression 18), and (Expression 19) are substituted in the above (Expression 8) and the resultant expression is arranged, average error voltage $\Delta V_{ON}$ in the case where the instantaneous value a of the U-phase modulation wave is smaller than zero (a<0) and the U-phase current IU flows in a negative direction can be derived as shown by the following (Expression 23).

$$\Delta V_{ON}=(1+a)\cdot V_{DON}+(1-a)\cdot V_{SON} \quad \text{(Expression 23)}$$

As shown by the above calculation results, (Expression 20) and (Expression 21) indicate the same result and (Expression 22) and (Expression 23) indicate the same result. Therefore, regardless of whether the instantaneous value a of the U-phase modulation wave is positive or negative, average error voltage $\Delta V_{ON}$ when the U-phase current IU flows in a positive direction can be calculated by (Expression 20) or (Expression 21), and average error voltage $\Delta V_{ON}$ when the U-phase current IU flows in a negative direction can be calculated by (Expression 22) or (Expression 23).

In addition, (Expression 20) or (Expression 21) indicating average error voltage $\Delta V_{ON}$ when the U-phase current IU flows in a positive direction is the same as (Expression 12) for calculating average error voltage $\Delta V_{ON}$ when the U-phase current IU flows in a positive direction in the case of dipolar modulation, which is described in the above embodiment 2, and (Expression 22) or (Expression 23) indicating average error voltage $\Delta V_{ON}$ when the U-phase current IU flows in a positive direction is the same as (Expression 13) for calculating average error voltage $\Delta V_{ON}$ when the U-phase current IU flows in a positive direction in the case of dipolar modulation. Therefore, in the present embodiment 4, the ON voltage calculation circuit 93a configured as shown in embodiment 2 (FIG. 10) can be employed for calculation of average error voltage $\Delta V_{ON}$.

Figure 15:
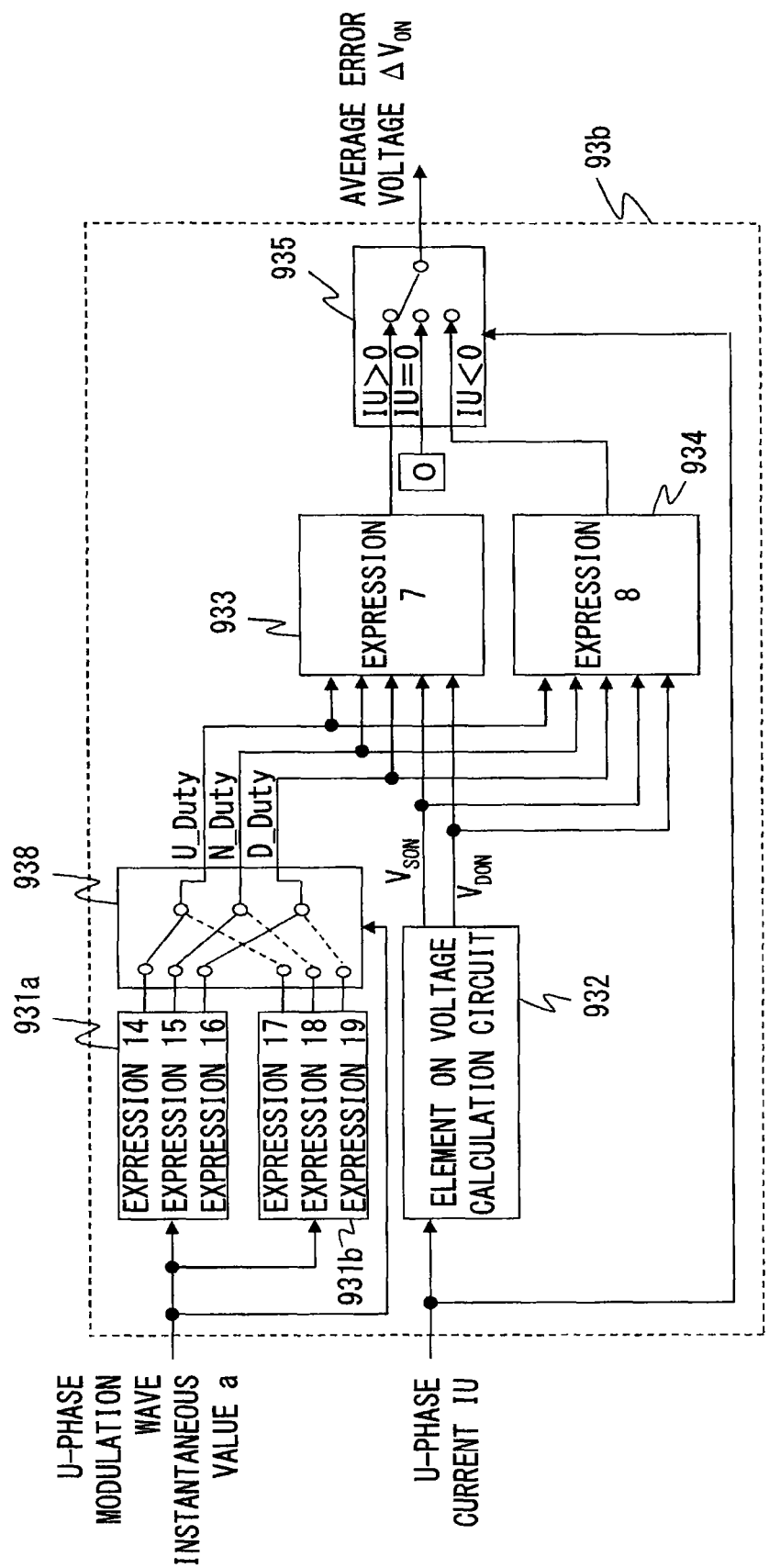
FIG. 15 is a configuration diagram of an ON voltage calculation circuit composing a control section which controls the 3-level power conversion circuit of the power conversion device.

As described above, in embodiment 4, for calculation of average error voltage $\Delta V_{ON}$ in the case of performing unipolar modulation in PWM control of the 3-level inverter, the ON voltage calculation circuit 93a configured as shown in embodiment 2 (FIG. 10) can be employed instead of employing the ON voltage calculation circuit 93b configured as shown in embodiment 3 (FIG. 15). Therefore, the configuration is simplified as compared to embodiment 3 and the calculation amount can be reduced. In addition, even in the case where the load 8 is driven using unipolar modulation, ON voltage correction can be performed appropriately, whereby accuracy of output voltage of the 3-level inverter can be enhanced.

Further, in the case of using the ON voltage calculation circuit 93a configured as shown in FIG. 10, the same ON voltage correction can be realized in either case of dipolar modulation or unipolar modulation, and therefore it is not necessary to switch the correction method. That is, the above embodiment 1 is directed to ON voltage correction in the case of dipolar modulation, and the above embodiment 3 is directed to ON voltage correction in the case of dipolar modulation. Therefore, it is necessary to switch the configuration in accordance with the operation state, e.g., dipolar modulation or unipolar modulation, but as described in the present embodiment 4, in the case of using the ON voltage calculation circuit 93a configured as shown in FIG. 10, it is possible to realize, ON voltage correction of the 3-level inverter in either case of dipolar modulation or unipolar modulation without the need of switching the ON voltage correction method, and enhance output voltage accuracy.

The present invention is not limited to only the configurations of the above embodiments 1 to 4. Without deviating the gist of the present invention, the above embodiments 1 to 4 may be freely combined with each other or the configurations of the above embodiments 1 to 4 may be modified or abbreviated as appropriate.

For example, the above embodiments 1 to 4 have shown the case where the load 8 is an induction motor as an example, but are applicable to the case of other AC motors. N-number (N is integer) of such AC motors may be connected in parallel to the output of the 3-level inverter. In addition, here, in application to the electric railroad vehicle, the case where the DC voltage source is the electric wire 2 has been described as an example. However, the DC voltage source may be obtained by power being supplied via a converter or a rectification circuit from a single-phase or three-phase AC electric wire. Alternatively, the DC voltage source may be obtained by power being supplied via a DC/DC converter from a storage battery. Further, here, a 3-level inverter has been shown in the above embodiments 1 to 4. However, a converter that has the same main circuit configuration and converts AC power supply to DC power supply may be used.

In addition, in the embodiments 1 to 4 of the present invention, the case of performing PWM control by dipolar modulation or unipolar modulation based on the magnitude relationship between the carrier waveform and the modulation wave, has been described. However, the present invention is also applicable to the case of performing PWM control by partial dipolar modulation, or the case of performing PWM control by a space vector method or the like in which the ratio of an output voltage pulse is directly calculated in each control cycle based on an output voltage vector.

It is noted that, within the scope of the present invention, the above embodiments may be freely combined with each other, or each of the above embodiments may be modified or abbreviated as appropriate.

INDUSTRIAL APPLICABILITY

The present invention relates to a power conversion device to which a 3-level power conversion circuit is applied, and is applicable to a wide range of power conversion devices that convert DC power to AC power or convert AC power to DC power.

The invention claimed is:

1. A power conversion device comprising:
   a 3-level power conversion circuit having a plurality of semiconductor switching elements and a plurality of flyback diodes, for converting DC voltage to voltage having three potentials of positive voltage, negative voltage, and zero voltage;
   a current detection section for detecting a current value inputted to or outputted from a terminal having the three potentials of the 3-level power conversion circuit;
   a voltage detection section for detecting the DC voltage; and
   a control section for performing ON/OFF control for the plurality of semiconductor switching elements of the 3-level power conversion circuit based on a voltage command value, wherein
   four semiconductor switching elements per phase are connected in series in the 3-level power conversion circuit,
   the 3-level power conversion circuit has a first diode connected between a neutral point and a connecting point between two semiconductor switching elements connected to a high potential side and a second diode connected between the neutral point and a connecting point between the two semiconductor switching elements connected to a low potential side for each phase, and
   the control section calculates ON voltage error caused due to ON voltage drop including ON voltage drop in the first diode or the second diode when current flows in the plurality of semiconductor switching elements and the plurality of flyback diodes, based on time ratios of the three potentials in a predetermined certain period and the current value from the current detection section, corrects the voltage command value by a voltage correction amount for correcting the ON voltage error, and performs ON/OFF control for the plurality of semiconductor switching elements of the 3-level power conversion circuit based on the corrected voltage command value.

2. The power conversion device according to claim 1, wherein the control section performs pulse width modulation control so that positive and negative voltage pulses are alternately outputted via zero voltage within a half cycle of output voltage of the 3-level power conversion circuit, and calculates the time ratios of the three potentials based on a ratio between the voltage command value and the DC voltage, and a ratio between a shift amount by which a carrier waveform is shifted in a positive or negative direction, and an amplitude of a carrier wave.

3. The power conversion device according to claim 1, wherein the control section performs pulse width modulation control so that a voltage pulse having a single polarity is outputted within a half cycle of output voltage of the 3-level power conversion circuit, and derives the time ratios of the three potentials from a ratio between the voltage command value and the DC voltage.

4. The power conversion device according to claim 2, wherein the predetermined certain period is a period at least equal o or longer than a half cycle of the carrier wave in a case where the pulse width modulation control is performed.

5. A power conversion device comprising:
   a 3-level power conversion circuit having a plurality of semiconductor switching elements and a plurality of flyback diodes, for converting DC voltage to voltage having three potentials of positive voltage, negative voltage, and zero voltage;

a current detection section for detecting a current value inputted to or outputted from a terminal having the three potentials of the 3-level power conversion circuit;

a voltage detection section for detecting the DC voltage; and a control section for performing ON/OFF control for the plurality of semiconductor switching elements of the 3-level power conversion circuit based on a voltage command value, wherein four semiconductor switching elements per phase are connected in series in the 3-level power conversion circuit, the 3-level power conversion circuit has a first diode connected between neutral point and a connecting point between two semiconductor switching elements connected to a high potential side and a second diode connected between the neutral point and a connecting point between the two semiconductor switching elements connected to a low potential side for each phase, and the control section calculates ON voltage error caused due to ON voltage drop including ON voltage drop in the first diode or the second diode when current flows in the plurality of semiconductor switching elements and the plurality of flyback diodes, based on a ratio between the voltage command value and the DC voltage, and the current value from the current detection section, corrects the voltage command value by a voltage correction amount for correcting the ON voltage error, and performs ON/OFF control for the plurality of semiconductor switching elements of the 3-level power conversion circuit based on the corrected voltage command value.

6. The power conversion device according to claim 5, wherein the control section switches a pulse width modulation control method in accordance with an operation state of the 3-level power conversion circuit but calculates the ON voltage error without switching a calculation method for the ON voltage error.

7. The power conversion device according to claim 3, wherein the predetermined certain period is a period at least equal to or longer than a half cycle of the carrier wave in a case where the pulse width nodulation control is performed.

* * * * *